(12) United States Patent
Li et al.

(10) Patent No.: US 8,193,572 B2
(45) Date of Patent: Jun. 5, 2012

(54) ELECTRONIC DEVICE INCLUDING TRENCHES AND DISCONTINUOUS STORAGE ELEMENTS

(75) Inventors: Chi-Nan Li, Austin, TX (US); Cheong Min Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/647,250

(22) Filed: Dec. 24, 2009

(65) Prior Publication Data
US 2010/0096686 A1   Apr. 22, 2010

Related U.S. Application Data

(62) Division of application No. 11/626,768, filed on Jan. 24, 2007, now Pat. No. 7,651,916.

(51) Int. Cl.
*H01L 29/76* (2006.01)

(52) U.S. Cl. .. 257/314; 257/316; 257/331; 257/E29.264

(58) Field of Classification Search .......... 257/314–326, 257/330–332, 366, E29.3, E29.262, E29.264
See application file for complete search history.

(56) References Cited

U.S. PATENT DOCUMENTS

| | | | |
|---|---|---|---|
| 4,184,207 A | 1/1980 | McElroy | |
| 4,751,558 A | 6/1988 | Kenney | |
| 4,785,337 A | 11/1988 | Kenney | |
| 4,833,094 A | 5/1989 | Kenney | |
| 4,860,070 A | 8/1989 | Arimoto et al. | |
| 4,929,988 A * | 5/1990 | Yoshikawa | 257/316 |
| 5,196,722 A | 3/1993 | Bergendahl et al. | |
| 5,252,845 A | 10/1993 | Kim et al. | |
| 5,315,142 A | 5/1994 | Acovic et al. | |
| 5,411,905 A | 5/1995 | Acovic et al. | |
| 5,432,365 A | 7/1995 | Chin et al. | |
| 5,460,988 A | 10/1995 | Hong | |
| 5,567,635 A | 10/1996 | Acovic et al. | |
| 5,705,415 A | 1/1998 | Orlowski et al. | |
| 5,721,448 A | 2/1998 | Hauf et al. | |
| 5,786,612 A | 7/1998 | Otani et al. | |
| 5,801,415 A | 9/1998 | Lee et al. | |

(Continued)

FOREIGN PATENT DOCUMENTS

JP   2003046003 A   2/2003

(Continued)

OTHER PUBLICATIONS

Yang, Edward S., "8-3 Channel Conductance", Fundamentals of Semiconductor Devices, McGraw Hill Book Co., p. 205, 1978.

(Continued)

*Primary Examiner* — Tucker Wright

(57) ABSTRACT

An electronic device can include a substrate including a first trench having a first bottom and a first wall. The electrode device can also include a first gate electrode within the first trench and adjacent to the first wall and overlying the first bottom of the first trench, and a second gate electrode within the first trench and adjacent to the first gate electrode and overlying the first bottom of the first trench. The electronic device can further include discontinuous storage elements including a first set of discontinuous storage elements, wherein the first set of the discontinuous storage elements lies between (i) the first gate electrode or the second gate electrode and (ii) the first bottom of the first trench. Processes of forming and using the electronic device are also described.

17 Claims, 13 Drawing Sheets

U.S. PATENT DOCUMENTS

| | | | |
|---|---|---|---|
| 5,824,580 A | 10/1998 | Hauf et al. | |
| 5,907,775 A | 5/1999 | Tseng | |
| 5,914,523 A | 6/1999 | Bashir et al. | |
| 5,923,046 A | 7/1999 | Tezuka et al. | |
| 5,943,267 A * | 8/1999 | Sekariapuram et al. | 365/185.28 |
| 5,969,383 A | 10/1999 | Chang et al. | |
| 5,998,263 A | 12/1999 | Sekariapuram et al. | |
| 6,060,743 A | 5/2000 | Sugiyama et al. | |
| 6,074,954 A | 6/2000 | Lill et al. | |
| 6,117,733 A | 9/2000 | Sung et al. | |
| 6,121,148 A | 9/2000 | Bashir et al. | |
| 6,133,601 A | 10/2000 | Watanabe | |
| 6,172,905 B1 | 1/2001 | White et al. | |
| 6,228,706 B1 | 5/2001 | Horak et al. | |
| 6,232,632 B1 | 5/2001 | Liu | |
| 6,265,268 B1 | 7/2001 | Halliyal et al. | |
| 6,281,064 B1 | 8/2001 | Mandelman et al. | |
| 6,287,917 B1 | 9/2001 | Park et al. | |
| 6,307,782 B1 | 10/2001 | Sadd et al. | |
| 6,320,784 B1 | 11/2001 | Nuralidhar et al. | |
| 6,330,184 B1 | 12/2001 | White et al. | |
| 6,344,403 B1 | 2/2002 | Madhukar et al. | |
| 6,365,452 B1 | 4/2002 | Perng et al. | |
| 6,368,916 B1 | 4/2002 | Nakagawa | |
| 6,372,617 B1 | 4/2002 | Kitamura | |
| 6,373,096 B1 | 4/2002 | Hisamune et al. | |
| 6,399,441 B1 | 6/2002 | Ogura et al. | |
| 6,433,382 B1 | 8/2002 | Orlowski et al. | |
| 6,461,905 B1 | 10/2002 | Wang et al. | |
| 6,486,028 B1 | 11/2002 | Chang et al. | |
| 6,537,870 B1 | 3/2003 | Shen | |
| 6,544,827 B2 | 4/2003 | Abiko | |
| 6,555,427 B1 | 4/2003 | Shimizu et al. | |
| 6,559,032 B2 | 5/2003 | Gonzalez et al. | |
| 6,583,466 B2 | 6/2003 | Lin et al. | |
| 6,605,839 B2 | 8/2003 | Miura et al. | |
| 6,620,664 B2 | 9/2003 | Ma et al. | |
| 6,638,810 B2 | 10/2003 | Bakli et al. | |
| 6,673,681 B2 | 1/2004 | Kocon et al. | |
| 6,674,120 B2 | 1/2004 | Fujiwara | |
| 6,677,204 B2 | 1/2004 | Cleeves et al. | |
| 6,687,156 B2 | 2/2004 | Kobayashi et al. | |
| 6,706,599 B1 | 3/2004 | Sadd et al. | |
| 6,709,922 B2 | 3/2004 | Ebina et al. | |
| 6,713,834 B2 | 3/2004 | Mori et al. | |
| 6,734,492 B2 | 5/2004 | Yamazaki et al. | |
| 6,747,308 B2 | 6/2004 | Mitros et al. | |
| 6,750,499 B2 | 6/2004 | Wu | |
| 6,754,105 B1 | 6/2004 | Chang et al. | |
| 6,762,092 B2 | 7/2004 | Yuan et al. | |
| 6,803,620 B2 | 10/2004 | Moriya et al. | |
| 6,816,414 B1 | 11/2004 | Prinz | |
| 6,818,508 B2 | 11/2004 | Shimizu et al. | |
| 6,818,512 B1 | 11/2004 | Hsieh | |
| 6,818,939 B1 | 11/2004 | Hadizad | |
| 6,852,597 B2 | 2/2005 | Park et al. | |
| 6,853,587 B2 | 2/2005 | Forbes | |
| 6,861,315 B1 | 3/2005 | Chen et al. | |
| 6,864,540 B1 | 3/2005 | Divakaruni et al. | |
| 6,878,991 B1 * | 4/2005 | Forbes | 257/328 |
| 6,881,994 B2 | 4/2005 | Lee et al. | |
| 6,894,339 B2 | 5/2005 | Fan et al. | |
| 6,903,418 B2 | 6/2005 | Iwamoto et al. | |
| 6,916,715 B2 | 7/2005 | Hsiao et al. | |
| 6,936,887 B2 | 8/2005 | Harari et al. | |
| 6,952,034 B2 | 10/2005 | Hu et al. | |
| 6,958,513 B2 | 10/2005 | Wang | |
| 6,991,984 B2 | 1/2006 | Ingersoll et al. | |
| 6,998,313 B2 | 2/2006 | Lin | |
| 7,015,537 B2 | 3/2006 | Lee et al. | |
| 7,037,787 B2 | 5/2006 | Fan et al. | |
| 7,045,423 B2 | 5/2006 | Ichige et al. | |
| 7,078,286 B1 | 7/2006 | Mehta | |
| 7,098,502 B2 | 8/2006 | Mathew et al. | |
| 7,110,299 B2 | 9/2006 | Forbes | |
| 7,112,490 B1 | 9/2006 | Hong et al. | |
| 7,122,432 B2 | 10/2006 | Shimizu et al. | |
| 7,126,188 B2 | 10/2006 | Shone | |
| 7,163,863 B2 | 1/2007 | Shone | |
| 7,192,830 B2 | 3/2007 | Goldbach et al. | |
| 7,196,935 B2 | 3/2007 | Forbes | |
| 7,199,419 B2 | 4/2007 | Haller | |
| 7,205,608 B2 | 4/2007 | Chindalore et al. | |
| 7,211,487 B2 | 5/2007 | Chindalore et al. | |
| 7,211,858 B2 | 5/2007 | Prinz | |
| 7,220,634 B2 | 5/2007 | Prall et al. | |
| 7,226,840 B2 | 6/2007 | Chindalore et al. | |
| 7,238,599 B2 | 7/2007 | Forbes | |
| 7,244,987 B2 | 7/2007 | Forbes | |
| 7,250,340 B2 | 7/2007 | Swift et al. | |
| 7,256,454 B2 | 8/2007 | Yater et al. | |
| 7,259,984 B2 | 8/2007 | Kan et al. | |
| 7,262,093 B2 | 8/2007 | Wang | |
| 7,262,997 B2 | 8/2007 | Yater et al. | |
| 7,276,762 B2 | 10/2007 | Forbes | |
| 7,279,740 B2 | 10/2007 | Bhattacharyya et al. | |
| 7,285,819 B2 | 10/2007 | Chindalore et al. | |
| 7,314,798 B2 | 1/2008 | Chindalore et al. | |
| 7,371,642 B2 | 5/2008 | Forbes | |
| 7,394,686 B2 | 7/2008 | Swift et al. | |
| 7,399,675 B2 | 7/2008 | Chindalore et al. | |
| 7,459,744 B2 | 12/2008 | Hong et al. | |
| 7,471,560 B2 | 12/2008 | Yater et al. | |
| 7,518,179 B2 | 4/2009 | Swift et al. | |
| 7,572,699 B2 | 8/2009 | Hong et al. | |
| 7,582,929 B2 | 9/2009 | Sadd et al. | |
| 7,592,224 B2 | 9/2009 | Swift et al. | |
| 7,619,270 B2 | 11/2009 | Chindalore et al. | |
| 7,619,275 B2 | 11/2009 | Sadd et al. | |
| 7,629,640 B2 | 12/2009 | She et al. | |
| 7,642,594 B2 | 1/2010 | Chindalore et al. | |
| 7,651,916 B2 | 1/2010 | Li et al. | |
| 7,838,922 B2 | 11/2010 | Li et al. | |
| 2002/0074565 A1 * | 6/2002 | Flagan et al. | 257/200 |
| 2002/0151136 A1 | 10/2002 | Lin et al. | |
| 2004/0000688 A1 | 1/2004 | Harari et al. | |
| 2005/0148173 A1 | 7/2005 | Shone | |
| 2006/0046383 A1 | 3/2006 | Chen et al. | |
| 2006/0131640 A1 | 6/2006 | Yu et al. | |

FOREIGN PATENT DOCUMENTS

| | | |
|---|---|---|
| JP | 2001286805 A | 4/2003 |
| JP | 2003309192 A | 10/2003 |
| WO | WO 2007014117 | 2/2007 |
| WO | WO 2007014118 | 2/2007 |

OTHER PUBLICATIONS

Van Houdt, J., et al. "An Analytical Model for the Optimization of Source-Side Injection Flash EEPROM Devices," IEEE Transactions on Electron Devices, vol. 42, No. 7, pp. 1314.

Guan, H., et al. "An Analytical Model for Optimization of Programming Efficiency and Uniformity of Split Gate Source-Side Injection Superflash Memory," IEEE Transactions on EI.

Hayashi, Y., et al. "Twin MONOS Cell with Dual Control Gates," 2000 Symposium on VLSI Technology Digest of Technical Papers, pp. 122-123, 2000.

Lee, D., et al. "Vertical Floating-Gate 4.5F2 Split-Gate NOR Flash Memory at 110nm Node," 2004 Symposium on VLSI Technology Digest of Technical Papers, pp, 72-73, 2004.

Ma, Y. et al. "A Dual-Bit Split-Gate EEPROM (DSG) Cell in Contactless Array for Single-Vcc High Density Flash Memories," IEDM, p. 57-60, 1994.

Osabe, T. et al. "Charge-Injection Length in Silicon Nanocrystal Memory Cells," 2004 Symposium on VLSI Technology Digest of Technical Papers p. 242-243, 2004.

Actions on the Merits by U.S.P.T.O as of Oct. 30, 2009, 14 pages.

U.S. Appl. No. 11/188,935 Advisory Action mailed Apr. 17, 2009, 4 pages.

U.S. Appl. No. 11/393,287 Notice of Allowance mailed May 29, 2009, 6 pages.

U.S. Appl. No. 11/188,615 Notice of Abandonment mailed Apr. 24, 2008, 2 pages.

U.S. Appl. No. 11/188,935 Notice of Allowance mailed Jul. 9, 2009, 8 pages.
U.S. Appl. No. 11/626,762 Notice of Allowance mailed Apr. 17, 2009, 9 pages.
U.S. Appl. No. 11/188,999 Notice of Allowance mailed May 4, 2009, 20 pages.
U.S. Appl. No. 11/188,591 Notice of Allowance mailed Jul. 24, 2009, 4 pages.
U.S. Appl. No. 11/188,615, filed Jul. 25, 2005.

* cited by examiner

| | CG1 2081 | SG1 2001 | SG2 2002 | CG2 2082 | CG3 2083 | SG3 2003 | SG4 2004 | CG4 2084 | BL1 2061 | BL2 2062 | BL3 2063 | BL4 2064 |
|---|---|---|---|---|---|---|---|---|---|---|---|---|
| PGM 20111 | 8 | 6 | 0 | 0 | 0 | 0 | 0 | 0 | 5 | 0 | FLOAT | FLOAT |
| READ 20111 | 3 | 5 | 0 | 0 | 0 | 0 | 0 | 0 | 1 | 0 | FLOAT | FLOAT |
| PGM 20112 | 8 | 3 | 0 | 0 | 0 | 0 | 0 | 0 | 5 | 0 | FLOAT | FLOAT |
| READ 20112 | 3 | 3 | 0 | 0 | 0 | 0 | 0 | 0 | 2 | 1 | FLOAT | FLOAT |
| PGM 20121 | 0 | 0 | 6 | 8 | 0 | 0 | 0 | 0 | 5 | 0 | FLOAT | FLOAT |
| READ 20121 | 0 | 0 | 5 | 3 | 0 | 0 | 0 | 0 | 1 | 0 | FLOAT | FLOAT |
| PGM 20122 | 0 | 0 | 3 | 8 | 0 | 0 | 0 | 0 | 5 | 0 | FLOAT | FLOAT |
| READ 20122 | 0 | 0 | 3 | 3 | 0 | 0 | 0 | 0 | 2 | 1 | FLOAT | FLOAT |
| PGM 20131 | 0 | 0 | 0 | 0 | 8 | 6 | 0 | 0 | 5 | 0 | FLOAT | FLOAT |
| READ 20131 | 0 | 0 | 0 | 0 | 3 | 5 | 0 | 0 | 1 | 0 | FLOAT | FLOAT |
| PGM 20132 | 0 | 0 | 0 | 0 | 8 | 3 | 0 | 0 | 5 | 0 | FLOAT | FLOAT |
| READ 20132 | 0 | 0 | 0 | 0 | 3 | 3 | 0 | 0 | 2 | 1 | FLOAT | FLOAT |
| PGM 20141 | 0 | 0 | 0 | 0 | 0 | 0 | 6 | 8 | 5 | 0 | FLOAT | FLOAT |
| READ 20141 | 0 | 0 | 0 | 0 | 0 | 0 | 5 | 3 | 1 | 0 | FLOAT | FLOAT |
| PGM 20142 | 0 | 0 | 0 | 0 | 0 | 0 | 3 | 8 | 5 | 0 | FLOAT | FLOAT |
| READ 20142 | 0 | 0 | 0 | 0 | 0 | 0 | 3 | 3 | 2 | 1 | FLOAT | FLOAT |
| PGM 20211 | 8 | 6 | 0 | 0 | 0 | 0 | 0 | 0 | FLOAT | FLOAT | 5 | 0 |
| READ 20211 | 3 | 5 | 0 | 0 | 0 | 0 | 0 | 0 | FLOAT | FLOAT | 1 | 0 |
| PGM 20212 | 8 | 3 | 0 | 0 | 0 | 0 | 0 | 0 | FLOAT | FLOAT | 5 | 0 |
| READ 20212 | 3 | 3 | 0 | 0 | 0 | 0 | 0 | 0 | FLOAT | FLOAT | 2 | 1 |
| PGM 20221 | 0 | 0 | 6 | 8 | 0 | 0 | 0 | 0 | FLOAT | FLOAT | 5 | 0 |
| READ 20221 | 0 | 0 | 5 | 3 | 0 | 0 | 0 | 0 | FLOAT | FLOAT | 1 | 0 |
| PGM 20222 | 0 | 0 | 3 | 8 | 0 | 0 | 0 | 0 | FLOAT | FLOAT | 5 | 0 |
| READ 20222 | 0 | 0 | 3 | 3 | 0 | 0 | 0 | 0 | FLOAT | FLOAT | 2 | 1 |
| PGM 20231 | 0 | 0 | 0 | 0 | 8 | 6 | 0 | 0 | FLOAT | FLOAT | 5 | 0 |
| READ 20231 | 0 | 0 | 0 | 0 | 3 | 5 | 0 | 0 | FLOAT | FLOAT | 1 | 0 |
| PGM 20232 | 0 | 0 | 0 | 0 | 8 | 3 | 0 | 0 | FLOAT | FLOAT | 5 | 0 |
| READ 20232 | 0 | 0 | 0 | 0 | 3 | 3 | 0 | 0 | FLOAT | FLOAT | 2 | 1 |
| PGM 20201 | 0 | 0 | 0 | 0 | 0 | 0 | 6 | 8 | FLOAT | FLOAT | 5 | 0 |
| READ 20201 | 0 | 0 | 0 | 0 | 0 | 0 | 5 | 3 | FLOAT | FLOAT | 1 | 0 |
| PGM 20202 | 0 | 0 | 0 | 0 | 0 | 0 | 3 | 8 | FLOAT | FLOAT | 5 | 0 |
| READ 20202 | 0 | 0 | 0 | 0 | 0 | 0 | 3 | 3 | FLOAT | FLOAT | 2 | 1 |

*FIG. 27*

ELECTRONIC DEVICE INCLUDING TRENCHES AND DISCONTINUOUS STORAGE ELEMENTS

RELATED APPLICATIONS

This is a divisional application of and claims priority under 35 U.S.C. §120 to U.S. patent application Ser. No. 11/626,768 entitled "Electronic Device Including Trenches and Discontinuous Storage Elements and Processes of Forming and Using the Same" by Li et al., filed Jan. 24, 2007, which is assigned to the current assignee hereof and incorporated herein by reference in its entirety.

This application is related to U.S. patent application Ser. No. 11/626,762 entitled "Electronic Device Including Fins and Discontinuous Storage Elements and Processes of Forming and Using the Same" by Hong et al. filed on Jan. 24, 2007, now U.S. Pat. No. 7,572,699, and Ser. No. 11/626,753 entitled "Electronic Device Including Trenches and Discontinuous Storage Elements and Processes of Forming and Using the Same" by Li et al. filed on Jan. 24, 2007, both of which are assigned to the current assignee hereof.

BACKGROUND

1. Field of the Disclosure

The present invention relates to electronic devices and processes, and more particularly, to electronic devices including trenches and discontinuous storage elements and processes of forming and using the electronic devices.

2. Description of the Related Art

Floating gate non-volatile memories ("FG NVM") are conventional and are commonly used in many applications. The three most common types of programming mechanisms for FG NVM include Fowler-Nordheim tunneling, conventional hot carrier injection, and source-side injection. Fowler-Nordheim tunneling is efficient but is very slow. Efficiency can be measured by dividing the number of carriers that enter a floating gate or one or more other storage elements divided by the number of carriers that enter a memory cell having the floating gate or the other storage element(s). The latter number can be approximated by using the product of the programming current and the programming time.

Hot carrier injection can include conventional hot carrier injection and source-side injection. Both involve the generation of hot carriers, some of which are injected into the floating or the other storage element(s). In conventional hot carrier injection when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A small fraction of carriers collide with silicon or one or more other atoms within the channel region, redirecting the energetic carriers to the floating gate or other charge storage element(s). An electrical field generated by a control gate electrode can help inject some of that small fraction of the hot carriers into the floating gate. Conventional hot carrier injection is inefficient and has high programming current.

Source-side injection is a popular compromise, with respect to efficiency and programming current, between Fowler-Nordheim tunneling and conventional hot carrier injection. With source-side injection, hot carriers are still generated, however, most of the hot carriers are generated within a portion of the channel region that is spaced apart from the drain region. Memory cells designed to be programmed by source-side injection are not without problems. Typically, the memory cells require one or more additional critical lithographic sequences and result in larger memory cells.

High density floating gate memories are becoming more difficult to fabricate in commercial volumes. As the thickness of the gate dielectric layer decreases, the likelihood of a pinhole or other defect extending through the thickness of the gate dielectric layer increases. Such a defect can cause an electrical short or leakage path between the substrate and the floating gate. The electrical short or leakage path can affect the voltage on the floating gate, and therefore, the memory cell may not be able to retain data. One or more materials may be used for the gate dielectric layer instead of silicon dioxide, however, such material(s) may have other issues, such as material compatibility with other materials used in the memory cell, require new equipment, increase manufacturing costs, etc.

BRIEF DESCRIPTION OF THE DRAWINGS

The invention is illustrated by way of example and not limitation in the accompanying figures.

FIGS. 25 through 27 include a circuit schematic diagram, a cross-sectional view of an exemplary physical embodiment of the circuit schematic diagram, and an operating voltage table for memory cells within an NVM array.

Figure 1:
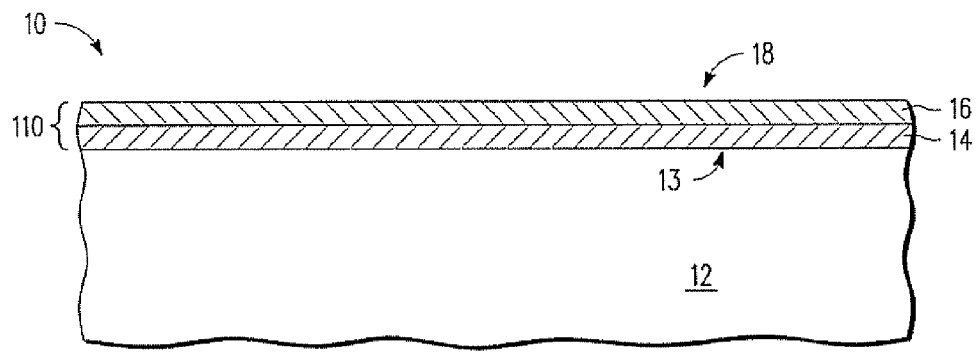
FIG. 1 includes an illustration of a cross-sectional view of a portion of a workpiece after forming a protective layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a substrate including a first trench having a first bottom and a first wall. The electrode device can also include a first gate electrode within the first trench and adjacent to the first wall and overlying the first bottom of the first trench, and a second gate electrode within the first trench and adjacent to the first gate electrode and overlying the first bottom of the first trench. The electronic device can further include discontinuous storage elements including a first set of discontinuous storage elements, wherein the first set of the discontinuous storage elements lies between (i) the first gate electrode or the second gate electrode and (ii) the first bottom of the first trench. Processes of forming and using the electronic device are also described.

The processes and structures described allow memory cells or portions thereof to be formed with gate electrodes and doped regions adjacent to the gate electrodes that have dimensions smaller than the resolution limits of lithographic processes. Also, a pair of control gate and select gate electrodes is formed within each trench. Other embodiments described herein allow for an electronic device having a contactless array.

Before addressing details of embodiments described below, some terms are defined or clarified. The term "discontinuous storage elements" is intended to mean spaced-apart objects capable of storing a charge. In one embodiment, substantially all discontinuous storage elements may be initially formed and remain separate from one another. In another embodiment, a substantially continuous layer of material formed an later separated into discontinuous storage elements. In yet another embodiment, substantially all discontinuous storage elements may be initially formed separate from one another, and later during the formation, some but not all of the discontinuous storage elements may coalesce.

The term "oriented" is intended to mean a principal direction in which a feature extends (e.g., from a top view, the longer of two dimensions of the feature, such as the length). As between different features at the same elevation or at different elevations, the features may be oriented substantially parallel, substantially perpendicular, or another angular relationship with respect to each other.

The term "stack" is intended to mean a plurality of layers or a plurality of at least one layer and at least one structure (e.g., nanocrystals), wherein the plurality of layers or plurality of layer(s) and structure(s) provides an electronic function. For example, a nonvolatile memory stack can include layers used to form at least part of a nonvolatile memory cell. A stack may be part of a larger stack. For example, a nonvolatile memory stack can include a charge storage stack that is used to store charge within a nonvolatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. To the extent not described herein, many details regarding specific materials, processing acts, and circuits are conventional and may be found in textbooks and other sources within the semiconductor and microelectronic arts.

FIG. 1 includes a cross-sectional view of a portion of an electronic device 10, such as an integrated circuit. The integrated circuit can be a standalone memory, a microcontroller, or other integrated circuit that includes a memory. In one embodiment, the electronic device 10 can include a nonvolatile memory ("NVM") array 18, a portion of which is illustrated in FIG. 1. A substrate 12 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of the substrate 12 in peripheral areas outside of the NVM array 18. The upper most surface of substrate 12 is a primary surface 13. Optionally, the doping concentration of the substrate 12 along the primary surface 13 within the NVM array 18 can be increased using a conventional or proprietary doping operation to potentially reduce leakage current between subsequently-formed gate electrodes that may overlie portions of the primary surface 13. A protective layer 110 can be formed over the primary surface 13 of the substrate 12. The protective layer 110 can include a pad layer 14 and an oxidation-resistant layer 16 over the pad layer 14. The protective layer 110 could have more or fewer layers than are illustrated. The protective layer 110 can remain over the peripheral areas until fabrication of the NVM array 18 is substantially completed. In one embodiment, the pad layer 14 includes oxide, and the oxidation-resistant layer 16 includes nitride.

Figure 2:
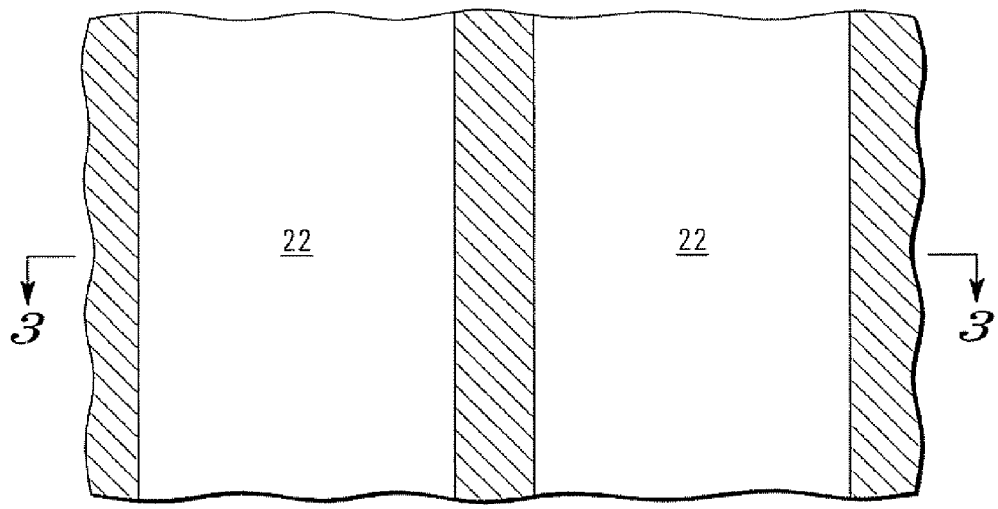
FIGS. 2 and 3 include illustrations of a top view and a cross-sectional view, respectively, of the workpiece of FIG. 1 after forming trenches.
Figure 3:
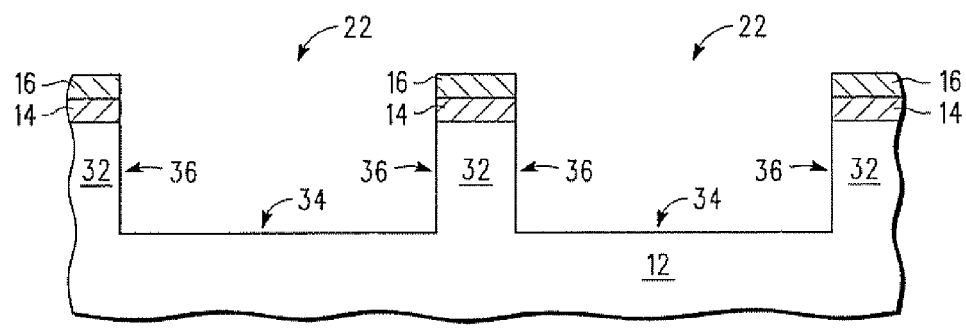

FIGS. 2 and 3 include illustrations of a top view and a cross-sectional view, respectively, of the memory array after etching trenches 22 to define mesas 32. A patterned resist layer (not illustrated), which includes openings at locations within the NVM array 18 where trenches are to be formed, is formed over the substrate 12 by a conventional or proprietary technique. Exposed portions of the protective layer 110 can then be removed by a conventional or proprietary technique to expose the primary surface 13. In one embodiment, the trenches 22 are formed prior to removal of the patterned resist layer. The patterned resist layer can then be removed, and the trenches 22 can then be formed by a conventional or proprietary technique. The trenches 22 extend from primary surface 13 and include bottoms 34 and walls 36. Referring to FIG. 2, the trenches 22 are oriented substantially parallel to one another. In one embodiment, the depths of trenches 22 are in a range of approximately 50 to approximately 500 nm. In one particular embodiment, the trenches 22 are formed using a timed anisotropic etch to produce the walls 36 that are substantially vertical. In one embodiment, the trenches 22 have substantially uniform depths. The trenches 22 are spaced apart from one another by the mesas 32, which include remaining portions of the substrate 12 between the trenches 22. After reading this specification, skilled artisans will appreciate that the trenches 22 can be shallower or deeper in other embodiments. Remaining portions of the protective layer 110 can be removed using a conventional or proprietary technique.

Figure 4:
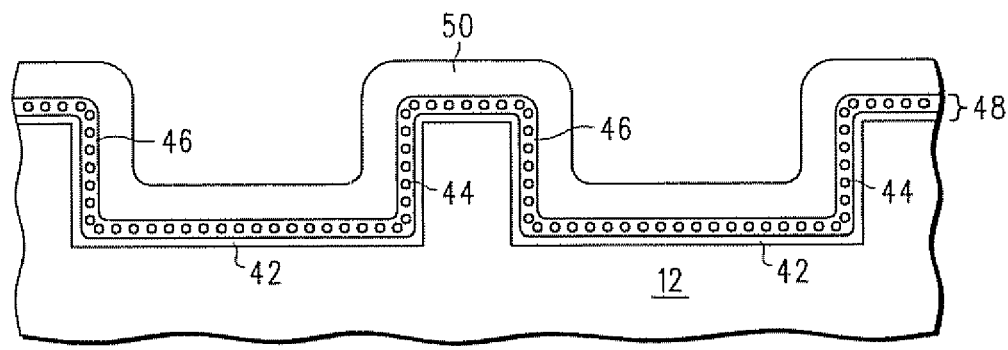
FIG. 4 includes an illustration of a cross-sectional view of a workpiece of FIGS. 2 and 3 after forming a layer of a gate electrode material.

A charge storage stack 48, including a dielectric layer 42, discontinuous storage elements 44, and another dielectric layer 46, can then be formed, as illustrated in FIG. 4. The dielectric layer 42 may be thermally grown using an oxidizing or nitridizing ambient, or deposited using a conventional or proprietary chemical vapor deposition technique, physical vapor deposition technique, atomic layer deposition technique, or a combination thereof. The dielectric layer 42 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The dielectric layer 42 has a thickness in a range of approximately 1 to approximately 10 nm. The thickness and material selection of the dielectric layer 42 will substantially determine its electrical properties. In one embodiment the thickness and material are chosen such that the dielectric layer 42 has a silicon dioxide equivalent thickness of less than 10 nm.

The discontinuous storage elements 44 are then formed over NVM array 18. In one embodiment, discontinuous storage elements 44 overlie the mesas 32 (including the primary surface 13 of the substrate 12) and lie within trenches 22. The individual discontinuous storage elements 44 are substantially physically separated from each other. The discontinuous storage elements 44 can include a material capable of storing a charge, such as silicon, a nitride, a metal-containing material, another suitable material capable of storing charge, or any combination thereof. For example, the discontinuous storage elements 44 can include silicon nanocrystals or metal nanoclusters. In one particular embodiment, a substantially continuous layer of amorphous silicon can be formed over exposed surfaces of the substrate 12. The substantially continuous layer can be exposed to heat or other processing conditions that can cause the layer to "ball up" or otherwise form silicon nanocrystals. The discontinuous storage elements 44 may be undoped, doped during deposition, or doped after deposition. In one embodiment, the discontinuous storage elements 44 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of the discontinuous storage elements 44 is no greater than approximately 10 nm in any dimension. In another embodiment, the discontinuous storage elements 44 can be larger, however, the discontinuous storage elements 44 are not formed so large as to form a continuous structure (i.e., all of the discontinuous storage elements 44 are not fused together).

The dielectric layer 46 is then formed over the discontinuous storage elements 44. The dielectric layer 46 can include one or more dielectric films, any of which may be thermally grown or deposited. The dielectric layer 46 can include any one or more materials or be formed using any of the embodiments as described with respect to the dielectric 42 layer. The dielectric layer 46 can have the same or different composition compared to the dielectric 42 layer and may be formed using the same or different formation technique compared to the dielectric layer 42.

A gate electrode material 50 is then formed overlying the workpiece and only partly fills remaining portions of the trenches 22, as illustrated in FIG. 4. The gate electrode material 50 can include a semiconductor-containing film, a metal-containing film, or any combination thereof. In one embodiment, the gate electrode material 50 includes polysilicon or amorphous silicon. In another embodiment, the gate electrode material 50 may include one or more other materials. In a particular embodiment, the thickness of gate electrode material 50 is not greater than approximately 200 nm, and in another particular embodiment is no greater than 90 nm. In yet another embodiment, the thickness of gate electrode material 50 is at least approximately 20 nm, and in another particular embodiment is at least 50 nm. In a finished device, the gate electrode material 50 can have a dopant concentration of at least $1E19$ atoms/cm$^3$ when gate electrode material 50 includes polysilicon or amorphous silicon.

The gate electrode material 50 can be deposited by chemical vapor deposition, physical vapor deposition, or a combination thereof. In an embodiment, the gate electrode material 50 can be deposited substantially conformally. In another embodiment, the gate electrode material 50 may not be completely conformal; however, a significant portion of the gate electrode material 50 still forms along the charge storage stack 48 near the walls 36 of the trenches 22. In one particular embodiment, the gate electrode material 50 is doped when deposited, and in another particular embodiment, is doped after it is deposited.

Figure 5:
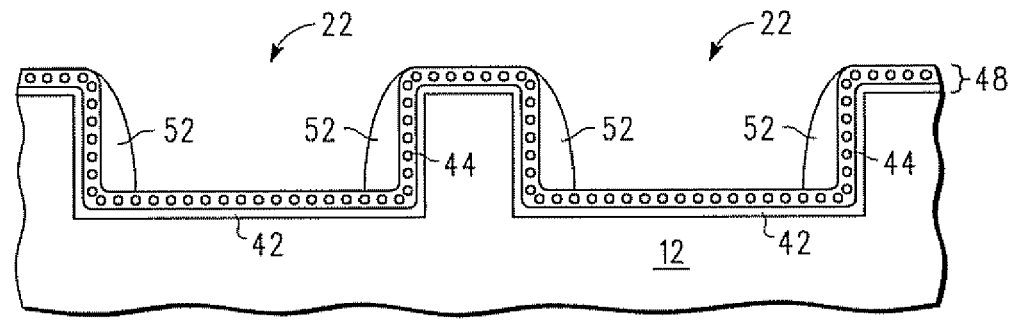
FIG. 5 includes an illustration of a cross-sectional view of a workpiece of FIG. 4 after forming gate electrodes.

FIG. 5 includes an illustration of a cross-sectional view after the gate electrode material 50 has been etched to form gate electrodes 52. In one embodiment, an anisotropic etch is performed to remove portions of gate electrode material 50 overlying the mesas 32 and portions of the bottoms of the trenches 22. In one embodiment, the gate electrodes 52 are in the form of sidewall spacers and have an arc-shaped outer surface, although other shapes can be used in other embodiments. In one embodiment, the bases of the gate electrodes 52 have widths that are approximately the same as the thickness of the gate electrode material as deposited. In another embodiment, the bases have widths that are at least half of the thickness of the gate electrode material as deposited. In a particular embodiment, each of the bases of the gate electrodes 52 are in a range of approximately 50 to approximately 90 nm wide. The etching chemistry and other etching parameters can use conventional or proprietary etching chemistries and etching parameters used for etching gate electrode materials. Although not illustrated, a mask and etch process sequence can be used to separate the gate electrodes 52 at the ends of the trenches 22, so that the gate electrodes 52 lying adjacent to opposite sides of the trenches 22 are not electrically shorted to each other. Portions of the charge storage stack 48 overlying the mesas 32 and lying between the gate electrodes 52 within the trenches 22 become exposed.

Figure 6:
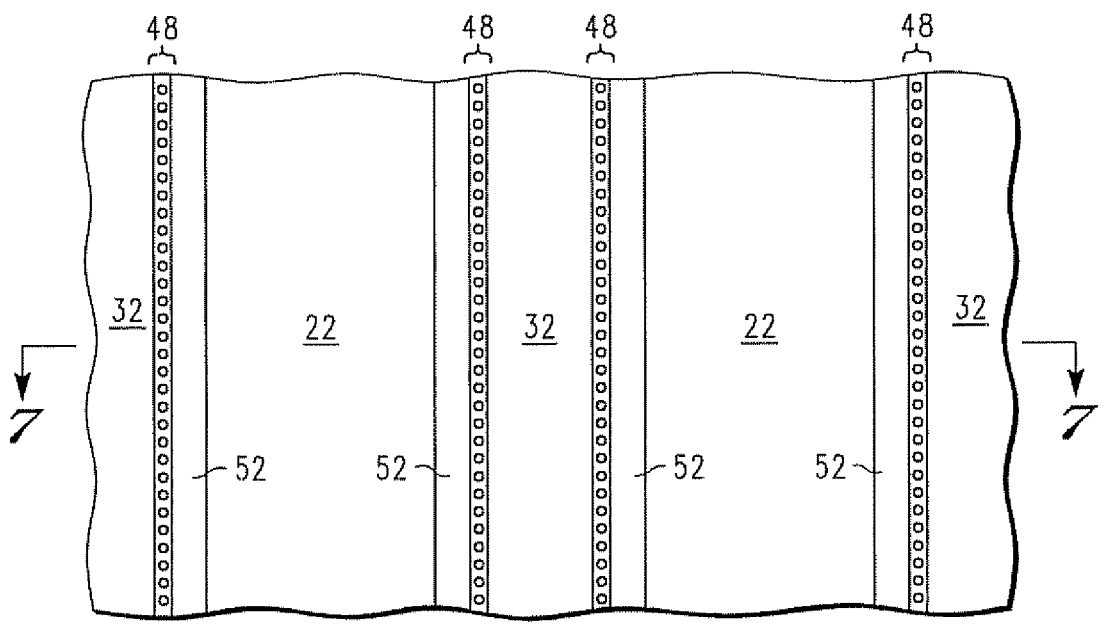
FIGS. 6 and 7 include illustrations of a top view and a cross-sectional view, respectively, of the workpiece of FIG. 5 after removing portions of the charge storage stack and forming insulating layers on exposed surfaces of the substrate and gate electrodes.
Figure 7:
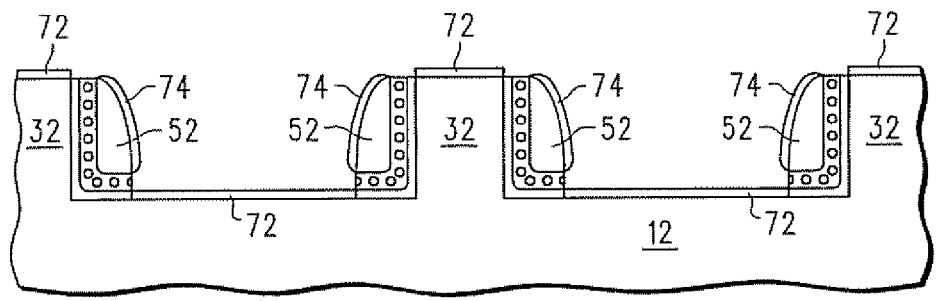

FIGS. 6 and 7 include illustrations of a top view and a cross-sectional view, respectively, after removing portions of the discontinuous storage elements 44 that are not protected by the gate electrodes 52. In FIG. 6 and other top views, some dielectric or insulating layers are not illustrated to simplify understanding of positional relationships between features within NVM array 18. The portions of the discontinuous storage elements 44 can be removed by removing substantially all of the exposed portions of the charge storage stack 48, removing part of the of the exposed portions of the charge storage stack 48, thermally consuming (e.g., oxidizing or nitriding) the portions of the discontinuous storage elements 44, or any combination thereof. As illustrated in the embodiment of FIG. 6, the trenches 22, the mesas 32, and the gate electrodes 52 are oriented substantially parallel to one another.

In one embodiment, substantially all of the exposed portions of the charge storage stack 48 is removed. In this embodiment, the dielectric layer 46 and the dielectric layer 42 can be etched. In a particular embodiment, the dielectric layer 42 can be removed by a wet etch that undercuts discontinuous storage elements 44, allowing them to be rinsed away. In another embodiment, exposed portions of dielectric layer 46 are removed, exposing discontinuous storage elements 44, which can then undergo additional processing to convert them from an electrically conducting material to an electrically insulating material. In one particular embodiment, discontinuous storage elements 44 are silicon nanocrystals that are oxidized to form silicon dioxide. In still another embodiment, the discontinuous storage elements 44 are etched, and the dielectric layer 42 remains. After reading this specification, skilled artisans will appreciate that other processes can be used to selectively remove the discontinuous storage elements 44 that are not protected by the gate electrodes 52.

As illustrated in the embodiment of FIG. 7, insulating layers 72 are formed over portions of the substrate 12 within the trenches 22 and over the mesas 32, and insulating layers 74 are formed along the exposed surfaces of the gate electrodes 52. The insulating layers 72 and 74 can include an oxide, a nitride, an oxynitride, or any combination thereof. The thickness of the insulating layers 72 acts as an implant screen during a subsequent ion implantation when forming source/drain ("S/D") regions. The insulating layer 74 helps to protect the gate electrodes 52 during subsequent processing. The insulating layers 72 and 74 can have a thickness in a range of approximately 5 to approximately 50 nm. The insulating layers 72 and 74 can have the same composition or different compositions and the same thickness or different thicknesses.

Many different embodiments can be used in forming the insulating layers 72 and 74. In one embodiment, exposed portions of the charge storage stack 48 (in FIG. 6) are removed, and the insulating layers 72 and 74 are formed by thermally oxidizing or nitriding parts of the substrate 12 and the gate electrodes 52. In another embodiment, the discontinuous storage elements 44 within the exposed portions of the charge storage stack 48 can be thermally oxidized or nitrided while the dielectric layer 42, and optionally, the dielectric layer 46 are present. While the discontinuous storage elements 44 are being oxidized or nitrided, the insulating layer 74 is formed along the exposed edges of the gate electrodes 52. In this embodiment, the insulating layer 72 is a composite that includes the dielectric layer 42, additional insulating material generated from the discontinuous storage elements 44, and optionally, the dielectric layer 46, addition insulating material from the substrate 12 or both the dielectric layer 46 and the additional insulating material. In still another embodiment (not illustrated), an insulating layer may be deposited over the substrate 12 and the gate electrodes 52, wherein the insulating layer is formed in place of or in conjunction with the insulating layers 72 and 74. The insulating layer has a composition and thickness as previously described for the insulating layers 72 and 74. Except as expressly recited herein, each of the insulating layers 72 and 74, and the deposited insulating layer is formed using a conventional or proprietary technique.

Figure 8:
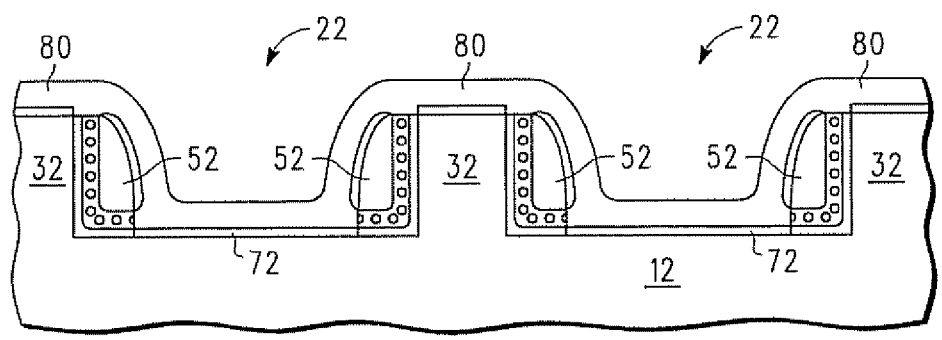
FIG. 8 includes an illustration of a cross-sectional view of the workpiece of FIGS. 6 and 7 after forming another layer of gate electrode material.

Another layer of gate electrode material 80 is then formed overlying the workpiece and only partly fills remaining portions of the trenches 22, as illustrated in FIG. 8. The gate electrode material 80 can include any of the materials, thicknesses, and formation processes as described with respect to the gate electrode material 50. As compared to the gate electrode material 50, the gate electrode material 80 may have the same composition or different compositions, the same thickness, or different thicknesses, be formed using by repeating the same process technique or different process techniques, or any combination thereof.

Figure 9:
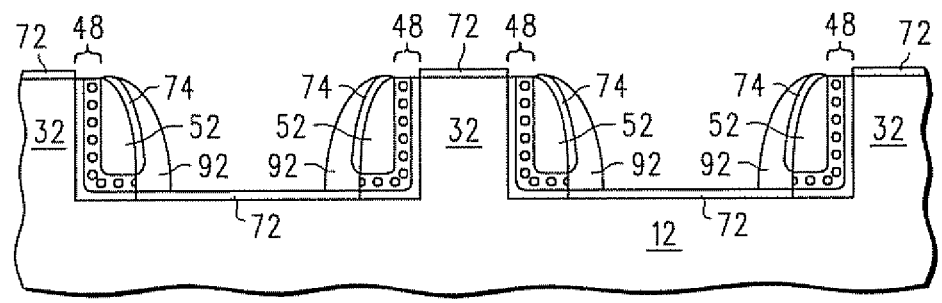
FIG. 9 includes an illustration of a cross-sectional view of the workpiece of FIG. 8 after forming another set of gate electrodes within the trenches.

FIG. 9 includes an illustration of a cross-sectional view after the gate electrode material 80 has been etched to form gate electrodes 92. In one embodiment, an anisotropic etch is performed to remove portions of gate electrode material 80 overlying the mesas 32 and portions of the bottoms of the trenches 22. In one embodiment, the gate electrodes 92 are in the form of sidewall spacers and have an arc-shaped outer surface, although other shapes can be used in other embodiments. In one embodiment, the bases of the gate electrodes 92 have widths that are approximately the same as the thickness of the gate electrode material as deposited. In another embodiment, the bases have widths that are at least half of the thickness of the gate electrode material as deposited. In a particular embodiment, each of the bases of the gate electrodes 92 are in a range of approximately 50 to approximately 90 nm wide. The etching chemistry and other etching parameters can use conventional or proprietary etching chemistries and etching parameters used for etching gate electrode materials. Although not illustrated, a mask and etch process sequence can be used to separate the gate electrodes 92 at the ends of the trenches 22, so that the gate electrodes 92 lying adjacent to opposite sides of the trenches 22 are not electrically shorted to each other.

Figure 10:
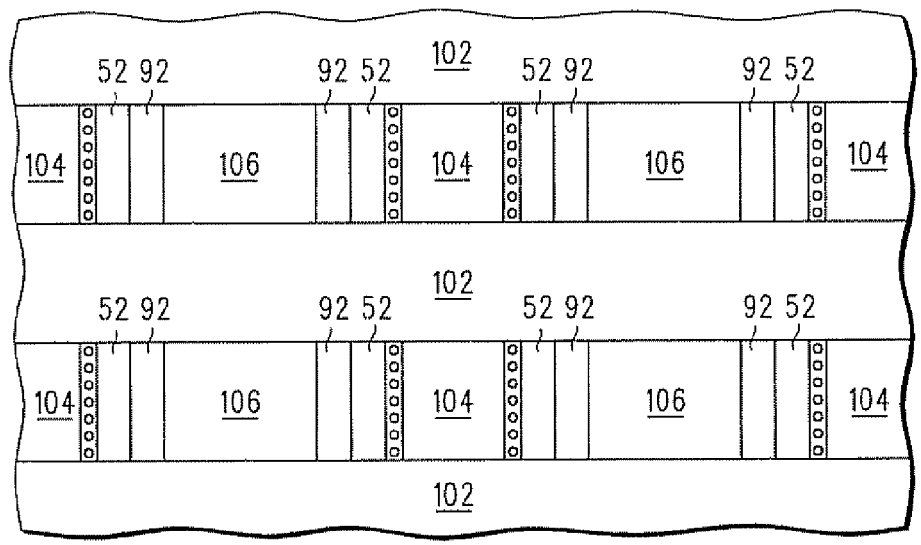
FIG. 10 includes an illustration of a top view of the workpiece of FIG. 9 after selectively doping portions of the substrate within the mesas and under bottoms of the trenches.
Figure 11:
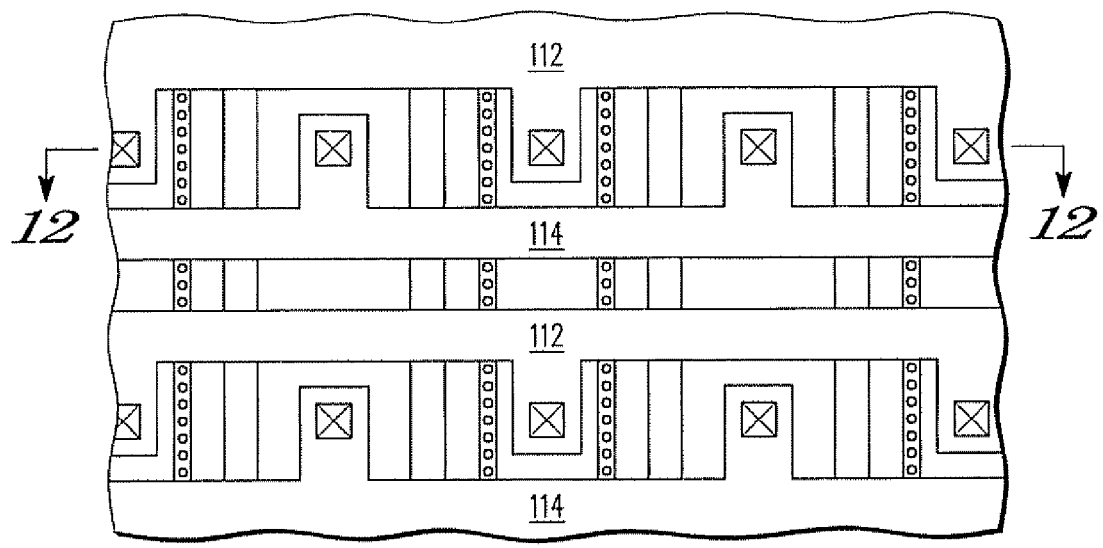
FIGS. 11 and 12 include illustrations of a top view and a cross-sectional view, respectively, of the workpiece of FIG. 10 after forming a substantially completed electronic device.
Figure 12:
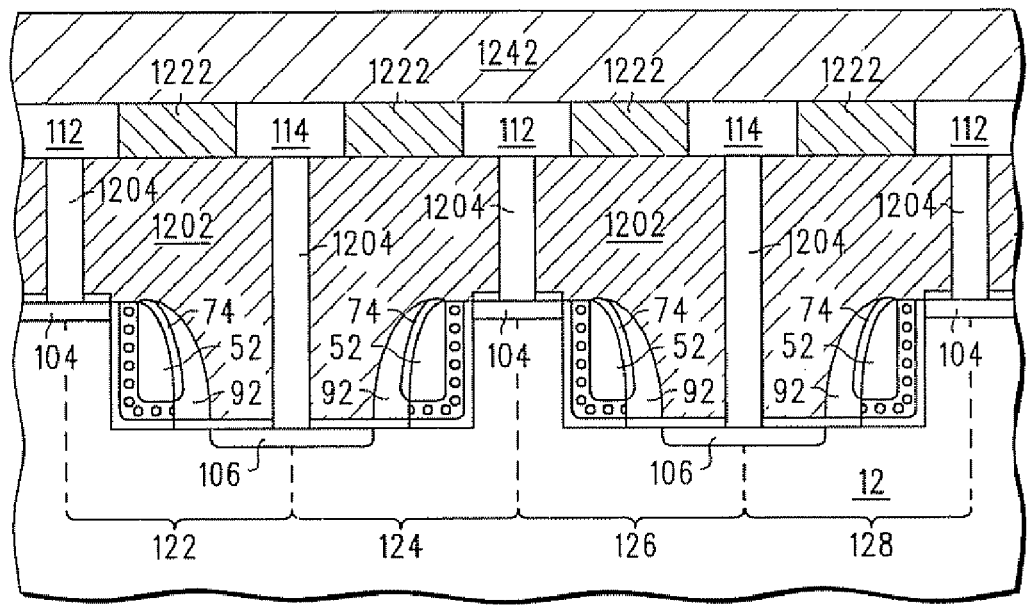

A variety of different layouts for the source/drain ("S/D") regions, bit lines, and word lines can be used. FIGS. 10 to 12 include a layout in which portions of the substrate 12 adjacent to the gate electrodes 92 and other portions of the substrate 12 adjacent to the gate electrodes 52 are doped, and bit lines are oriented substantially perpendicular to the gate lines. Referring to FIG. 10, a masking layer is formed over the array and includes masking members 102 and openings between the masking members 102. The masking members 102 are oriented substantially perpendicular to the gate electrodes 52 and 92. A dopant is introduced into portions of the substrate between the masking members 102 to form doped regions 104 and 106. The doped regions 104 include portions of the substrate 12 within the mesas 32, and the doped regions 106 include portions of the substrate 12 below the bottoms of the trenches 22. In one embodiment, the doped regions 104 and 106 can act as S/D regions. The dopant may be a p-type dopant (e.g., boron) or an n-type dopant (e.g., phosphorus or arsenic). In one embodiment, the dopant can be introduced using ion implantation. The masking members 102 are then removed by a conventional or proprietary technique. In one embodiment, the implanted dopant is activated by one or more subsequent thermal cycles, which may or may not serve a different primary purpose such as oxidation, deposition, annealing, drive or activation of a different implant dopant. In one embodiment, each of the doped regions 104 and 106 has a dopant concentration of at least approximately 1E19 atoms/cm$^3$. The formation of the masking members 102, their subsequent removal, and doping to form the doped regions 104 and 106 are performed using conventional of proprietary techniques. In one embodiment, the NVM array 18 is now substantially complete other than formation of the electrical connections. Component fabrication within peripheral areas (not illustrated) of the electronic device can be performed using one or more conventional or proprietary techniques.

FIGS. 11 and 12 include illustrations of a top view and a cross-sectional view, respectively, of a substantially completed electronic device. FIG. 11 does not illustrate the insulating layers formed after forming the doped regions 104 and 106 to simplify understanding of the positional relationships between the conductive members (e.g., gate electrodes, doped regions, conductive lines, etc.) of the electronic device. FIG. 11 includes conductive lines 112 and 114 that are oriented substantially perpendicular to the gate electrodes 52 and 92. In one embodiment, the conductive lines 112 and 114 are bit lines. The conductive lines 112 are electrically connected to the doped regions 104 (within the mesas 32), and the conductive lines 114 are electrically connected to the doped regions 106 (below the bottoms of the trenches 22).

FIG. 12 includes a cross-sectional view at sectioning line 12-12 in FIG. 11. The process is described with respect to FIG. 12. An interlevel dielectric layer 1202 is formed over the workpiece by a conventional or proprietary technique. The interlevel dielectric layer 1202 is patterned to form contact openings that extend to doped regions 104 and 106 and to other portions of the NVM array 18 that are not illustrated in FIGS. 11 and 12. The interlevel dielectric layer 1202 can include an insulating material, such as an oxide, a nitride, an oxynitride, or a combination thereof. In a specific embodiment, an anisotropic etch can be used to form contact openings.

Conductive plugs 1204 and the conductive lines 112 and 114 are then formed. The conductive plugs 1204 and the conductive lines 112 and 114 can include the same or different conducting materials. Each of the conductive plugs 1204 and the conductive lines 112 and 114 can include doped silicon, tungsten, titanium, tantalum, titanium nitride, tantalum nitride, aluminum, copper, another suitable conductive material, or any combination thereof. In one particular embodiment, the conductive plugs 1204 include tungsten, and the conductive lines 112 and 114 include copper. An optional barrier layer, adhesion layer, or any combination thereof may be formed before the corresponding conductive layers (e.g., tungsten for the conductive plugs 1204 and copper for the conductive lines 112 and 114). An optional capping layer (e.g., a metal-containing nitride) may be used to encapsulate copper within the conductive lines 112 and 114.

In one embodiment, the conductive plugs 1204 are formed before the conductive lines 112 and 114. In one particular embodiment, a conductive layer (not illustrated) is formed over interlevel dielectric layer 1202 and substantially fills contact openings therein. Portions of the conductive layer that lie outside the contact openings are removed to form the conductive plugs 1204. In one embodiment, a conventional or proprietary chemical-mechanical polishing operation can be performed, and in another embodiment, a conventional or proprietary etching process can be performed.

Another insulating layer 1222 is then deposited and patterned to form interconnect trenches where the conductive lines 112 and 114 are formed. Other interconnect trenches can be formed at locations within the NVM array 18, outside the NVM array 18, or any combination thereof. In one embodiment, another conductive layer is formed over the interlevel dielectric layer 1202 and substantially fills the interconnect trenches in the insulating layer 1222. Portions of the conductive layer that lie outside the interconnect trenches within the insulating layer 1222 are removed to form the conductive lines 112 and 114. In one embodiment, a conventional or proprietary chemical-mechanical polishing operation can be performed, and in another embodiment, a conventional or proprietary etching process can be performed. The insulating layer 1222 lies at substantially the same elevation as and between the conductive lines 112 and 114. In another embodiment (not illustrated), the conductive plugs 1202 and the conductive lines 112 and 114 are formed concurrently using a conventional or proprietary dual-inlaid process.

In another embodiment (not illustrated), additional insulating and conductive layers can be formed and patterned to form one or more additional levels of interconnects. After the last interconnect level has been formed, an encapsulating layer 1242 is formed over substrate 12, including the NVM array 18 and peripheral areas. The encapsulating layer 1242 can include one or more insulating Elm, such as an oxide, a nitride, an oxynitride, or a combination thereof. The NVM array 18 includes memory cells 122, 124, 126, and 128.

Figure 13:
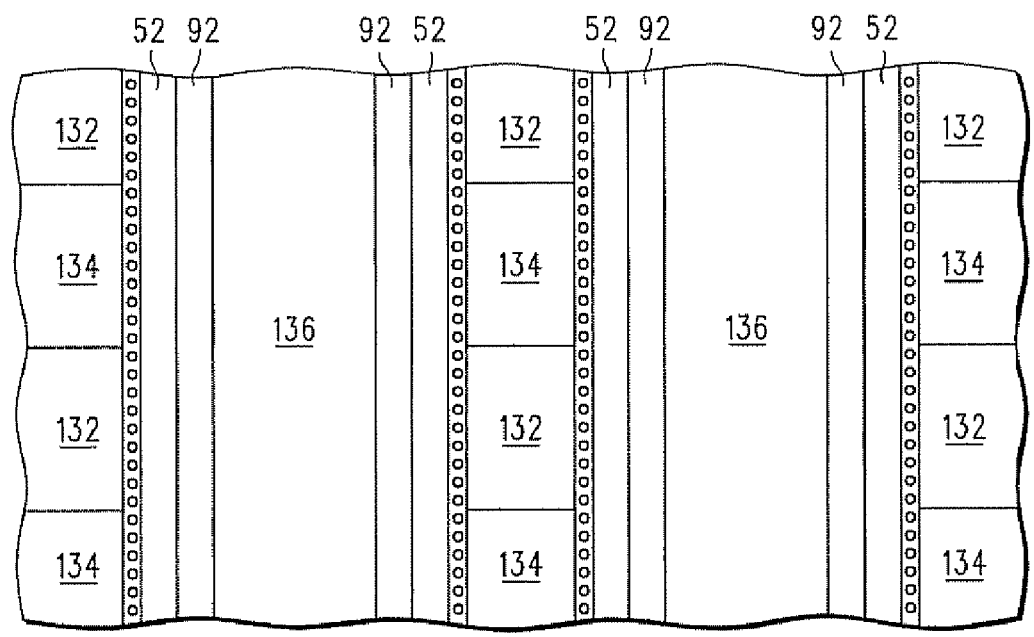
FIG. 13 includes an illustration of a top view of the workpiece of FIG. 9 after selectively doping portions of the substrate within the mesas and under bottoms of the trenches.
Figure 14:
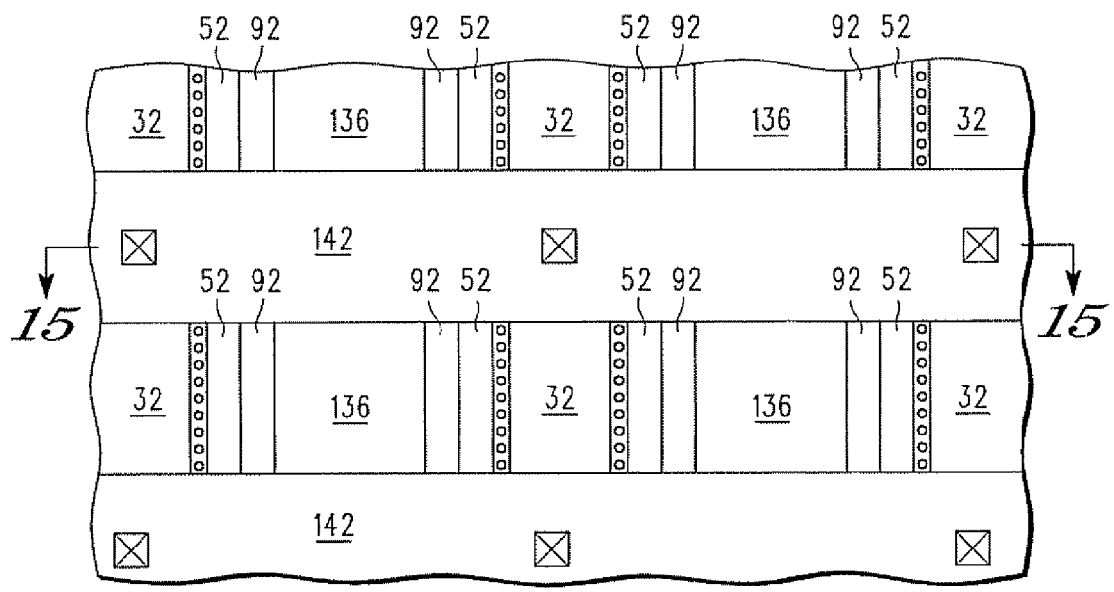
FIGS. 14 and 15 include illustrations of a top view and a cross-sectional view, respectively, of the workpiece of FIG. 13 after forming a substantially completed electronic device.
Figure 15:
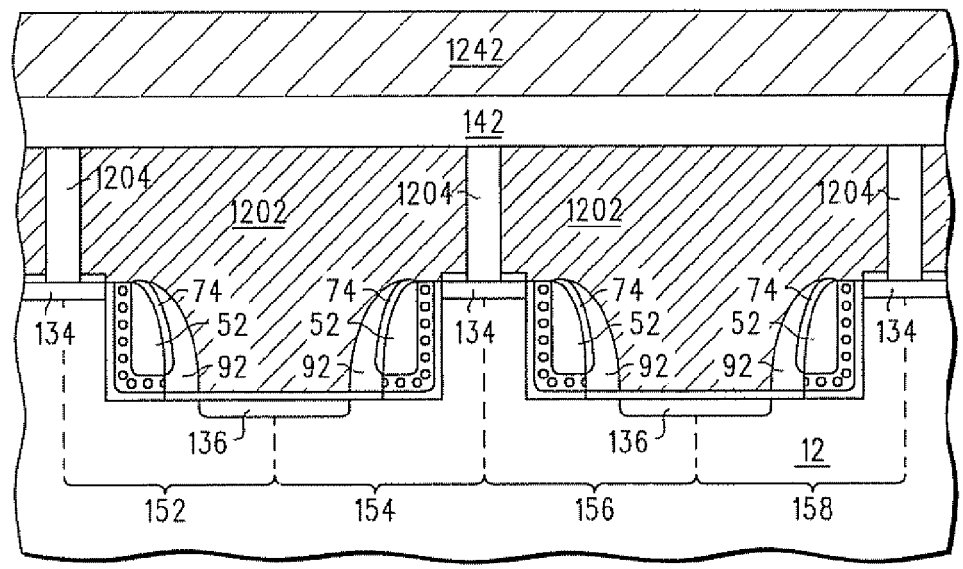

FIGS. 13 to 15 illustrate another embodiment having a different layout for the source/drain ("S/D") regions and bit lines. FIGS. 13 to 15 include a layout in which portions of the substrate 12 adjacent to the gate electrodes 92 and other portions of the substrate 12 adjacent to the gate electrodes 52 are doped, and other bit lines are oriented substantially parallel to the gate electrodes 52 and 92. In this embodiment, the process through formation of the gate electrodes 92 (FIG. 9) can be performed using any embodiment as previously described with respect to FIGS. 1 to 9.

Referring to FIG. 13, a masking layer is formed over the array and includes masking members 132 and openings between the masking members 132. As illustrated, the masking members 132 cover portions of the mesas 32, and in another embodiment, the masking members 132 can cover portions of the gate electrodes 52 and 92 but do not cover portions of the substrate 12 that lie under the trenches 22. A dopant is introduced into portions of the substrate 12 to form doped regions 134 and 136. The doped regions 134 include portions of the substrate 12 within the mesas 32, and the doped regions 136 include portions of the substrate 12 below the bottoms of the trenches 22. In one embodiment, the doped regions 134 and 136 can act as S/D regions. In the illustrated embodiment, the doped region 136 is oriented substantially parallel to the gate electrodes 52 and 92 and acts as a bit line. The dopant may be a p-type dopant (e.g., boron) or an n-type dopant (e.g., phosphorus or arsenic). In one embodiment, the dopant can be introduced using ion implantation. The masking members 132 are then removed by a conventional or proprietary technique. In one embodiment, the implanted dopant is activated by one or more subsequent thermal cycles, which may or may not serve a different primary purpose such as oxidation, deposition, annealing, drive or activation of a different implant dopant. In one embodiment, each of doped regions 134 and 136 has a dopant concentration of at least approximately 1E19 atoms/cm$^3$. The formation of the masking members 132, their subsequent removal, and doping to form the doped regions 134 and 136 are performed using conventional or proprietary techniques. In one embodiment, the NVM array 18 is now substantially complete other than formation of the electrical connections. Component fabrication within peripheral areas (not illustrated) of the electronic device can be performed using one or more conventional or proprietary techniques.

FIGS. 14 and 15 include illustrations of a top view and a cross-sectional view, respectively, of a substantially completed electronic device. FIG. 14 does not illustrate the insulating layers after forming the doped regions 134 and 136 to simplify understanding of the positional relationships between the conductive members (e.g., gate electrodes, doped regions, conductive lines, etc) of the electronic device. FIG. 14 includes conductive lines 142 that are oriented substantially perpendicular to the doped regions 136 and the gate electrodes 52 and 92. In one embodiment, the conductive lines 142 are bit lines. The conductive lines 142 are electrically connected to the doped regions 134 (within the mesas 32). Portions of the mesas 32 that were not doped when forming the doped regions 134 are illustrated as mesas 32 in FIG. 14.

FIG. 15 includes a cross-sectional view at sectioning line 15-15 in FIG. 14. The process is described with respect to FIG. 15. The process of forming the interlevel dielectric layer 1202, conductive plugs 1204, and insulating layer 1222 (not illustrated) are formed using any of the embodiments described with respect to FIGS. 11 and 12. The insulating layer 1222 is patterned to form interconnect trenches. Referring to FIG. 14, the remaining portions (not illustrated) of the insulating layer 1222 lie between the conductive lines 142, and the interconnect trenches lie where the conductive lines 142 are to be formed.

The conductive lines 142 are then formed. The conductive lines 142 can include any of the materials as previously described with respect to the conductive plugs 1204 and the conductive lines 112 and 114. More particularly, after the insulating layer 1222 is then deposited and patterned to form interconnect trenches, a conductive layer is formed over the interlevel dielectric layer 1202 and substantially fills the interconnect trenches in the insulating layer 1222. Portions of the conductive layer that lie outside the interconnect trenches within the insulating layer 1222 are removed to form the conductive lines 142. In one embodiment, a conventional or proprietary chemical-mechanical polishing operation can be performed, and in another embodiment, a conventional or proprietary etching process can be performed. The insulating layer 1222 lies at substantially the same elevation as and between the conductive lines 142. In another embodiment (not illustrated), the conductive plugs 1202 and the conductive lines 142 are formed concurrently using a conventional or proprietary dual-inlaid process.

In another embodiment (not illustrated), additional insulating and conductive layers can be formed and patterned to form one or more additional levels of interconnects. After the last interconnect level has been formed, the encapsulating layer 1242 is formed over substrate 12, including the NVM array 18 and peripheral areas. The NVM array 18 includes memory cells 152, 154, 156, and 158.

Another layout can be used in another embodiment (not illustrated). The masking, doping, and bit line orientations described with respect to FIGS. 13 to 15 can be reversed. The doped regions 134 can be continuous along the trenches, and the doped regions 136 can be segmented. The conductive lines 142 would be electrically connected to the doped regions 136, rather than the doped regions 134.

Figure 16:
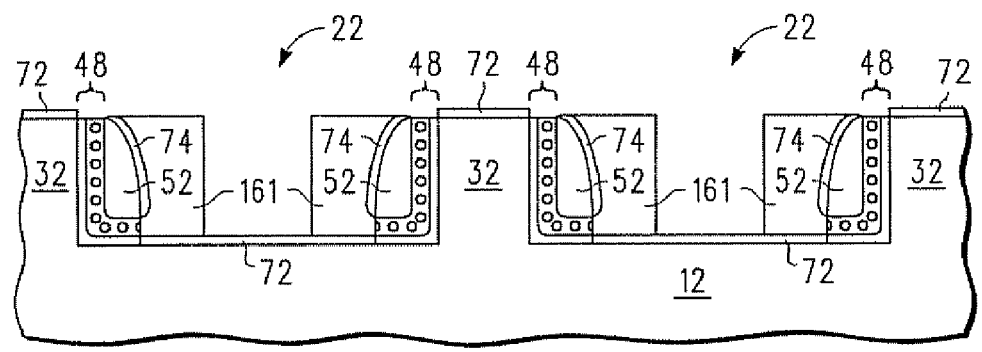
FIGS. 16 through 20 include illustrations of the workpiece when forming buried bit lines and gate electrodes, wherein the gate electrode are electrically connected to a gate line in accordance with an alternative embodiment.

In yet another layout as illustrated in FIGS. 16 to 20, a spacer including a gate electrode material can be segmented into a plurality of gate electrodes to allow word lines, select lines, or other gate lines to be oriented substantially perpendicular to the trenches 22. A workpiece is processed using any of the embodiments as described with respect to FIGS. 1 to 8. The gate electrode material 80 (in FIG. 8) is etched to form sidewall spacers 161 as illustrated in FIG. 16. In this embodiment, the sidewall spacers 161 have more of a squared-off shape as compared to the gate electrodes 92 in FIG. 9. The sidewall spacers 161 are formed using a conventional or proprietary processing technique. In a particular embodiment, the sidewall spacers extend along substantially all of the lengths of the trenches 22.

Figure 17:
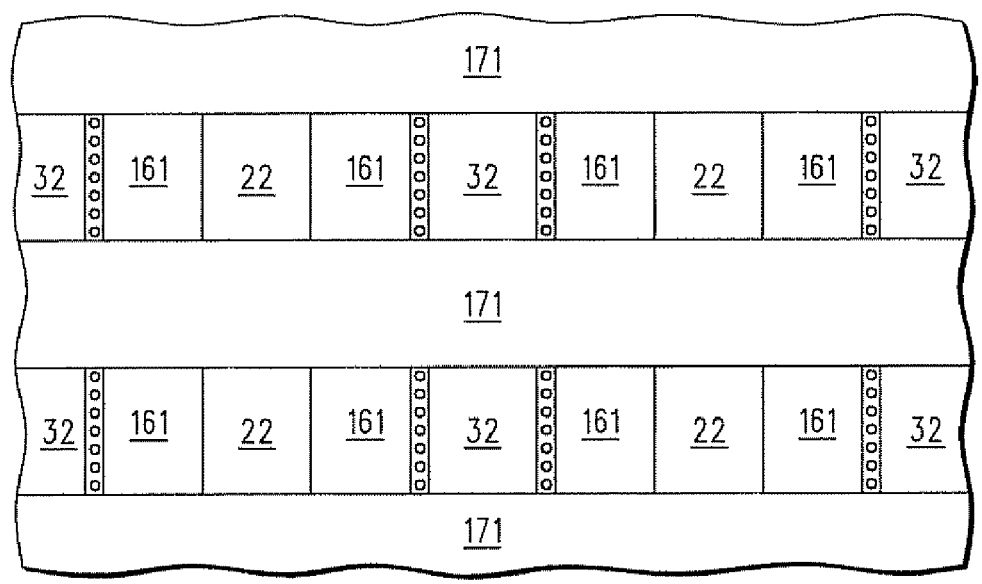

FIG. 17 includes an illustration of a top view after forming a patterned masking layer over the workpiece. A masking layer is deposited and patterned to define the masking members 171. Exposed portions of the sidewall spacers 161 are etched. The sidewall spacer etch is selective to insulating layers. Therefore, the insulating layers 72 protect portions of the substrate 12 within the mesas 32, and the insulating layers 74 protect the gate electrodes 52 when the sidewall spacers 161 are etched. The masking members 171 are then removed. The patterned masking layer formation, sidewall spacer etch, and patterned masking layer removal are performed using convention or proprietary processing operations.

Figure 18:
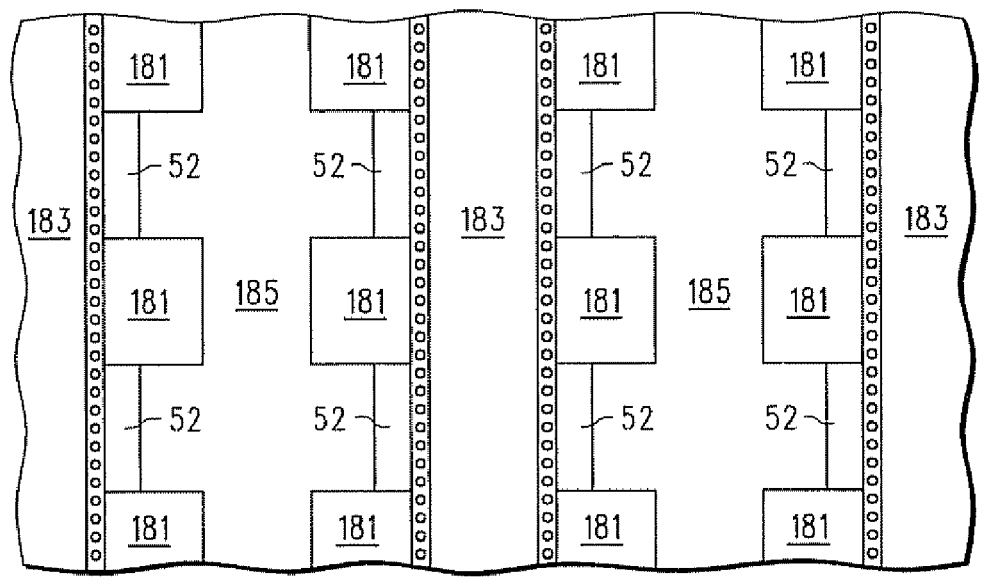

FIG. 18 includes gate electrodes 181, which are remaining portions of the sidewall spacers 161. The gate electrodes 52 are substantially continuous along the walls of the trenches, and portions of the gate electrodes 52 are covered by the gate electrodes 181. Doped regions 183 are formed within the mesas 32, and doped regions 185 are formed along the bottoms of the trenches 22. The doped regions 183 and the doped regions 185 act as source/drain regions and are formed using an embodiment previous described. The trenches 22, the gate electrodes 52, the doped regions 183, and the doped regions 185 are oriented substantially along the same direction.

Figure 19:
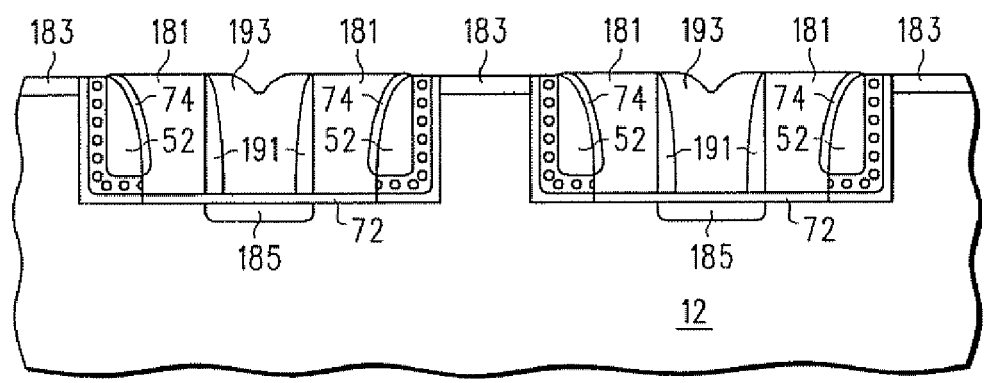

FIG. 19 includes an illustration of the workpiece after forming insulating spacers 191 and 193. In one embodiment, the insulating spacers 191 and 193 include different material and are formed when forming spacer structures in the logic regions (outside the NVM array 18). The insulating spacers 191 can include an oxide, and the insulating spacers 193 can include a nitride. As illustrated, the two sides of the insulating spacers 193 merge in the middle of the trench 22. If the merge does not occur, a dep-etch-dep process can be formed that preferentially fills in the lowest exposed portions of the trenches, while not forming a significant amount of nitride over the source/drain regions 183, the gate electrodes 181, or any combination thereof. The insulating spacers 191 and 193 are formed using a conventional or proprietary processing sequence.

Figure 20:
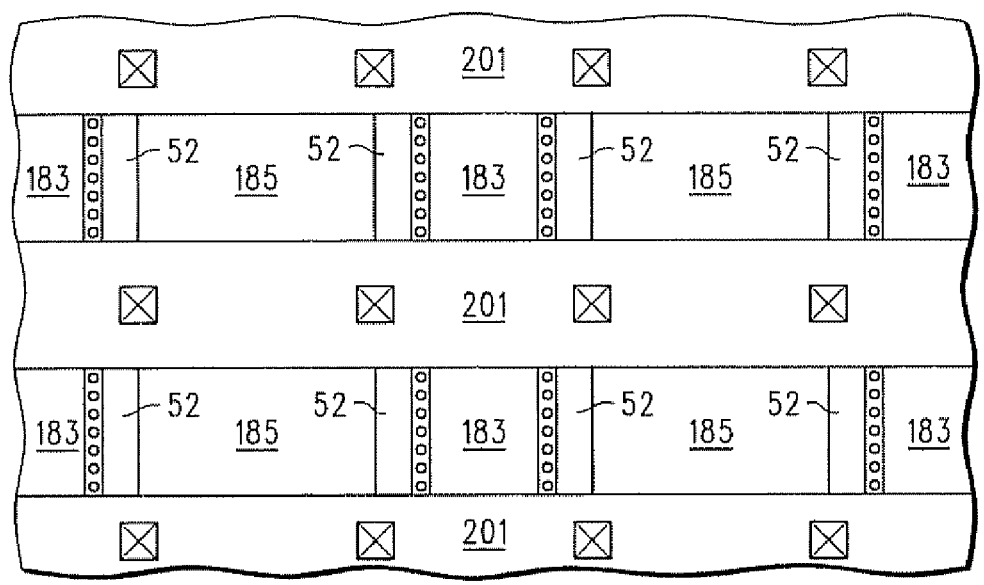

FIG. 20 includes an illustration of top view of a substantially completed electronic device. Gate lines 201 are formed and are electrically connected to the gate electrodes 181 (not illustrated in FIG. 20) that underlie the gate lines 201. In a particular embodiment, the gate lines 201 act as select gate lines, and the gate electrodes 181 act as select gate electrodes. The gate lines 201 are oriented substantially perpendicular to the trenches 22, the gate electrodes 52, the doped regions 183, the doped regions 185, or any combination thereof. The remaining processing to form the substantially completed electronic device can using any embodiment as described with respect to FIGS. 11 and 12.

Still other layouts can be used but are not illustrated. For example, buried bit lines can be used both within the trenches and outside the trenches. Doped regions within the substrate 12 can extend along the length of the trenches. Spaced-apart field isolation regions can be formed along the bottoms of the trenches 22 before forming the gate electrodes 52 or 92. When forming the doped regions for the S/D regions, as previously described, the spaced-apart field isolation regions help to form a plurality of spaced-apart doped regions along the bottoms of those trenches that include the spaced-apart field isolation regions. Appropriate bit line contacts can then be made to those spaced-apart doped regions.

In another example (not illustrated), buried bit lines can be formed within the substrate 12, underlie the trenches 22 and be spaced apart from the bottoms 34 of the trenches 22. The buried bit lines would be oriented substantially perpendicular to the trenches 22, similar to the orientation of the conductive lines 142 in FIG. 14. After forming the buried bit lines, a semiconductor layer can be epitaxial grown over the buried bit lines and have a thickness that is greater than the depth of the trenches. The semiconductor layer can be formed using a conventional or proprietary technique. Trenches are formed using an embodiment previously described. The bottoms 34 of the trenches 22 are spaced apart from the buried bit lines by portions of the semiconductor layer. After forming the trenches 22 and the gate electrodes 62, a masking layer is formed with masking members within the then be formed within the trenches 22. The pattern would be similar to the masking layer described with respect to FIG. 13, except that the masking members would lie within the trenches 22 and would not overlie the mesas 32. Doping would be performed similar to forming the doped regions 134 and 136 in FIG. 13. The doped regions 136 extend to the buried bit lines to form an electrical connection. However, the doped regions 134 are spaced apart from the buried bit lines, and therefore, the doped regions 134 are not electrically connected to the buried bit lines below the trenches 22. In this particular embodiment, a contactless array can be formed. After reading this specification, skilled artisans will appreciate that still other layouts can be used.

Figure 21:
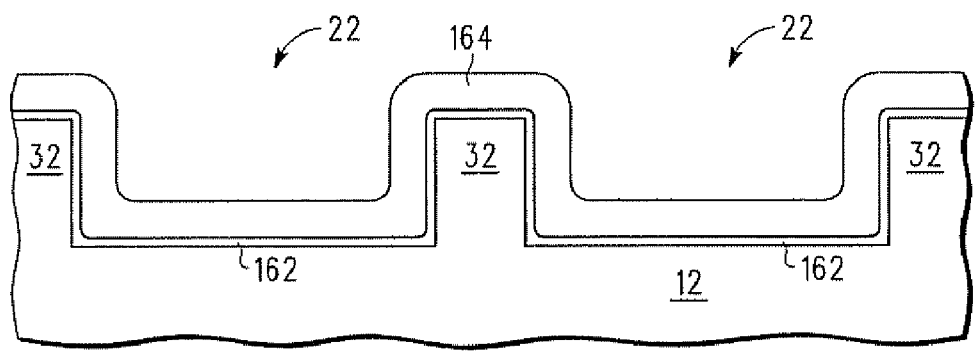
FIG. 21 includes an illustration of a cross-sectional view of a workpiece of FIGS. 2 and 3 after forming a dielectric layer and a layer of a gate electrode material.

FIGS. 21 to 24 illustrate another embodiment in which the location of the discontinuous storage elements is different. In this embodiment, the process through formation of the trenches 22 and removal of the remaining portions of the protective layer 110 can be performed using any embodiment as previously described with respect to FIGS. 1 to 3. A dielectric layer 162 can be formed along the exposed surface of the substrate 12, as illustrated in FIG. 21. The dielectric layer 162 can be formed using any of the materials, thicknesses, and formation techniques as described with respect to the dielectric layer 42. A gate electrode material 164 is then formed overlying the workpiece and only partly fills remaining portions of the trenches 22, as illustrated in FIG. 21. The gate electrode material 164 can be formed using any of the materials, thicknesses, and formation techniques as described with respect to the gate electrode material 50.

Figure 22:
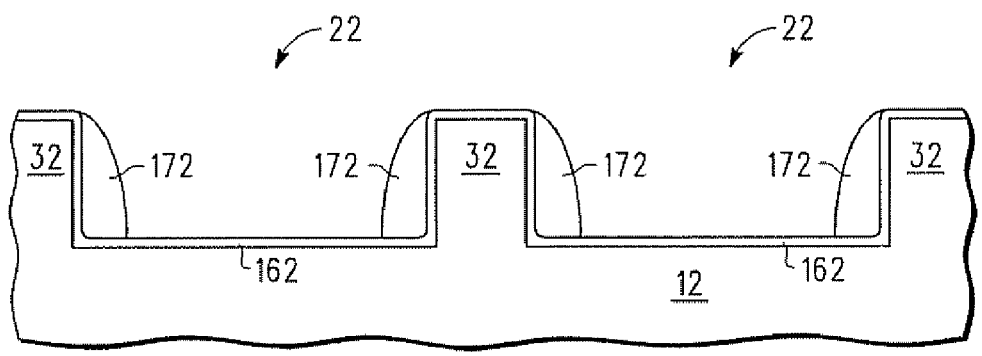
FIG. 22 includes an illustration of a cross-sectional view of a workpiece of FIG. 21 after forming gate electrodes and an insulating layer on exposed surfaces of the substrate and gate electrodes.

FIG. 22 includes an illustrations of a cross-sectional view after the gate electrode material 164 has been etched to form gate electrodes 172. The gate electrodes 172 can be formed using any of the previously described embodiments with respect to the gate electrodes 62. Remaining portions of the protective layer 110 (not illustrated in FIG. 22) are then removed using a conventional or proprietary technique. A dielectric layer 174 is then formed over portions of the substrate 12 within the trenches 22 and over the mesas 32, and along the exposed surfaces of the gate electrodes 172. The dielectric layer 174 can be formed using any of the materials and formation techniques as described with respect to the insulating layer 72 or 74. The dielectric layer 172 has a thickness in a range of approximately 1 to approximately 9 nm overlying the mesas 32 and portions of the bottoms of the trenches 22.

Figure 23:
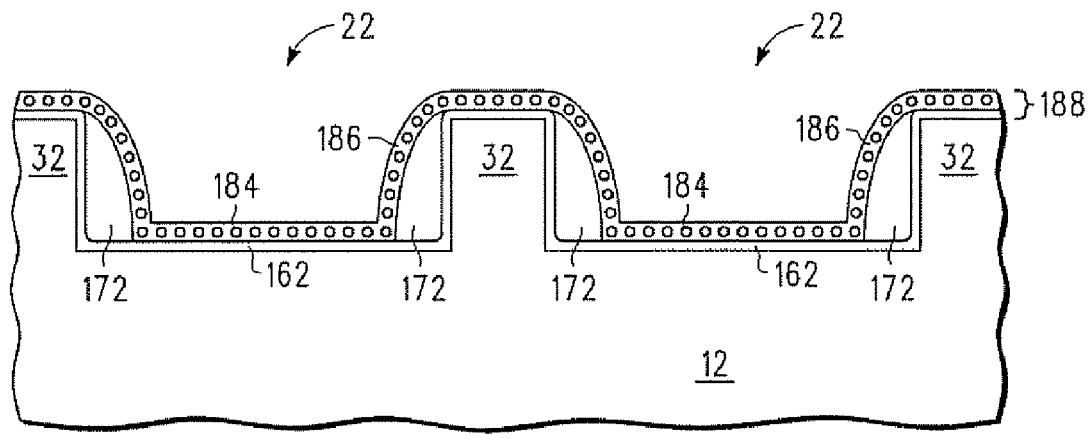
FIG. 23 includes an illustration of a cross-sectional view of a workpiece of FIG. 22 after forming a charge storage stack.

FIG. 23 includes an illustration of a cross-sectional view of the workpiece after forming the remainder of the charge storage stack 188. Discontinuous storage elements 184 are formed over NVM array 18. The discontinuous storage elements 184 can be formed using any of the materials, thicknesses, and formation techniques as described with respect to the discontinuous storage elements 44. A dielectric layer 186 is then formed over the discontinuous storage elements 184. The dielectric layer 186 can be formed using any of the materials, thicknesses, and formation techniques as described with respect to the dielectric layer 46. The charge storage stack includes the dielectric layer 174, the discontinuous storage elements 184, and the dielectric layer 186.

In one embodiment, portions of the discontinuous storage elements 184 lying along substantially vertical or more highly sloped surfaces (e.g., along the lower portions of the gate electrodes 172 within the trenches) are removed. In a particular embodiment, a material different from the dielectric layer 174, the dielectric layer 186, or both can be formed substantially thicker along substantially horizontal surfaces, as opposed to substantially horizontal surfaces. Different physical vapor or chemical vapor deposition techniques can be used. In a more particular embodiment, the dielectric layers 174 and 186 can include oxide, and a nitride layer (not illustrated) can be deposited using a collimated sputtering technique. An isotropic nitride etchant can remove the nitride layer along the substantially vertical or more highly sloped surfaces, while leaving remaining portions of the nitride layer overlying the substantially horizontal or less highly sloped surfaces. An isotropic oxide etchant can remove exposed portions of the dielectric layer 174 and the dielectric layer 186, while other portions of the charge storage stack 188 are protected by remaining portions of the nitride layer. After the isotropic oxide etch, the remaining portions of the nitride layer can remain or be removed. In another embodiment (not illustrated), the selective removal process previously described can be omitted, and the charge storage stack 188 can remain along all exposed surfaces.

Figure 24:
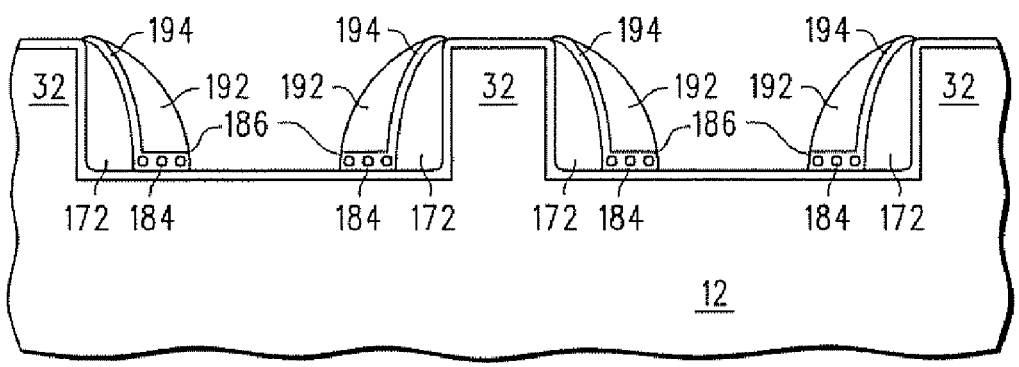
FIG. 24 include illustrations of a cross-sectional view of the workpiece of FIG. 23 after forming additional gate electrodes and removing exposed portions of the charge storage stack.

A gate electrode material is deposited over the workpiece and etched to form gate electrodes 192, as illustrated in FIG. 24. The gate electrode material and gate electrodes 192 can be formed using any of the materials, thicknesses, and formation techniques as described with respect to the gate electrode material 50 and the gate electrode 92. An intergate insulating layer 194 lies between the gate electrodes 172 and 192. The intergate insulating layer 194 can be formed from portions of the charge storage stack 188, the gate electrodes 172, or any combination thereof. Although not illustrated, the process flow can be continued with the formation of doped regions, insulating layers, conductive plugs, conductive lines, and passivation layers using any one or more embodiments as previously described.

The NVM array 18 can include memory cells using any of the layouts as previously described. Circuit schematics and cross references to physical embodiments are described to illustrate better how memory cells within NVM array 18 can be electrically configured and used.

Figure 25:
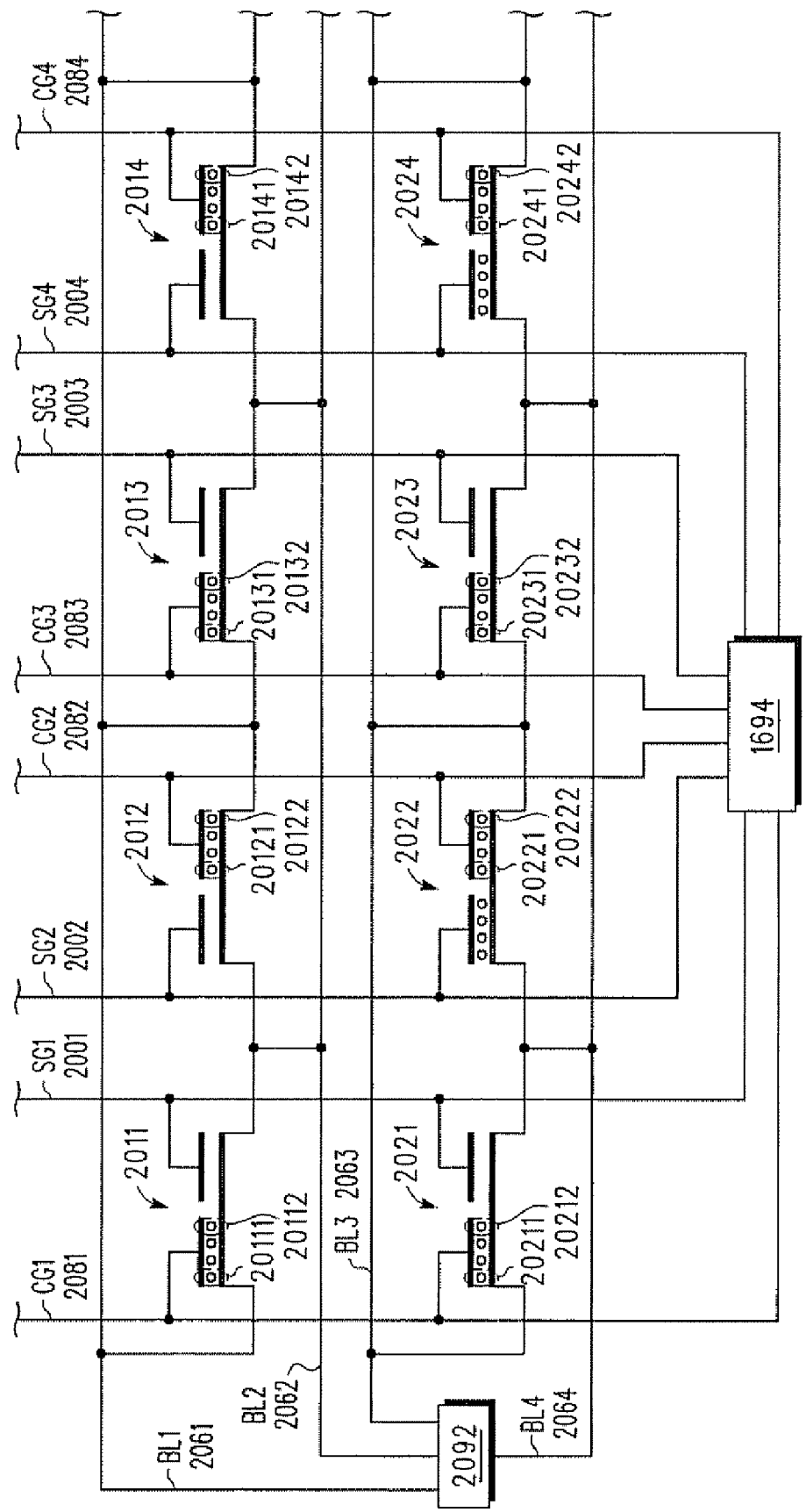
Figure 26:
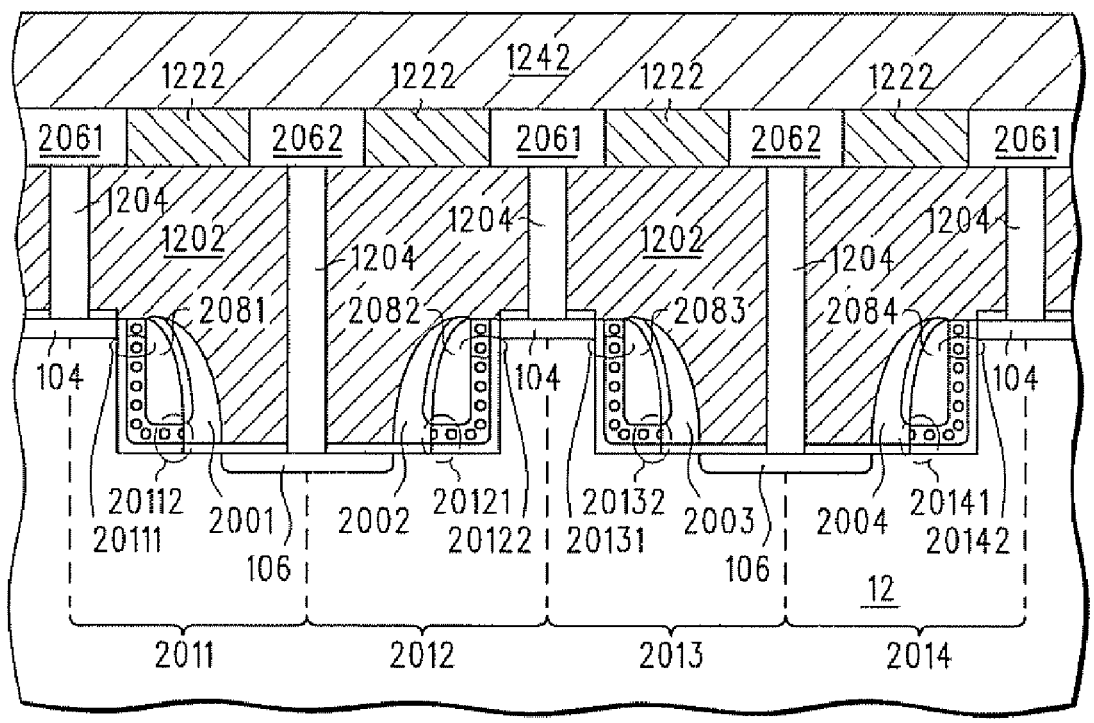

FIG. 25 includes a circuit schematic for an embodiment as described with respect to the embodiment as illustrated in FIG. 26. Memory cells 2011, 2012, 2013, 2014, 2021, 2022, 2023, and 2024 are oriented within the NVM array 18, as illustrated in FIG. 25.

Referring to FIG. 25, BL1 2061 is electrically connected to S/D regions of the memory cells 2011, 2012, 2013, and 2014, and BL2 2062 is electrically connected to the other S/D regions of the memory cells 2011, 2012, 2013, and 2014. BL3 2063 is electrically connected to S/D regions of the memory cells 2021, 2022, 2023, and 2024, and BL4 2064 is electrically connected to the other S/D regions of the memory cells 2021, 2022, 2023, and 2024.

CG1 2081 is electrically connected to control gate electrodes of the memory cells 2011 and 2021, and SG1 2001 is electrically connected to select gate electrodes of the memory cell 2011 and 2021. CG2 2082 is electrically connected to control gate electrodes of the memory cells 2012 and 2022, and SG2 2002 is electrically connected to select gate electrodes of the memory cell 2012 and 2022. CG3 2083 is electrically connected to control gate electrodes of the memory cells 2013 and 2023, and SG3 2003 is electrically connected to select gate electrodes of the memory cell 2013 and 2023. CG4 2084 is electrically connected to control gate electrodes of the memory cells 2014 and 2024, and SG4 2004 is electrically connected to select gate electrodes of the memory cell 2014 and 2024.

A bit line control module 2092 is coupled to BL1 2061, BL2 2062, and BL3 2063, and BL4 2064. A gate line control module 2094 is coupled to CG1 2081, SG1 2001, SG2 2002, CG2 2082, CG3 2083, SG3 2003, SG4 2004, and CG4 2084. Each of the bit line control module 2092 and the gate line control module 2094 are conventional or proprietary and may include row or column decoders, voltage drivers, other suitable circuits to operate the NVM array 18, or any combination thereof. Each of the bit line control module 2092 and the gate line control module 2094 can include more than one control module. Each of the bit line control module 2092 and the gate line control module 2094 can be biased or electrically float to achieve the proper operation of the NVM array 18.

FIG. 26 illustrates a physical embodiment of a portion of the NVM array 18 corresponding to the row that includes the memory cells 2011, 2012, 2013, and 2014. FIG. 26 is substantially the same as FIG. 12 except that reference numbers as used in the circuit schematics are used in FIG. 26.

Charge storage regions for the memory cells 2011, 2012, 2013, and 2014 are illustrated in FIGS. 25 and 26. The memory cell 2011 includes charge storage regions 20111 and 20112, the memory cell 2012 includes charge storage regions 20121 and 20122, the memory cell 2013 includes charge storage regions includes charge storage regions 20131 and 20132, and the memory cell 2014 includes charge storage regions 20141 and 20142. The memory cells 2021 to 2024 include similar charge storage regions to the memory cells 2011 to 2014, respectively, but are not illustrated in FIG. 26.

FIG. 27 includes a table that has some of the operating voltages for memory cells along the top row of memory cells, as illustrated in FIG. 25. When programming charge storage region 20111 in accordance with one embodiment, BL1 2061 and BL2 2062 are biased to allow electrons to flow from BL2 2061 to BL1 2061. Each of CG1 2081 and SG1 2001 is biased to allow carriers to flow through the channel region of memory cell 2011. All other gate lines (e.g., CG2 2082, SG2 2002, etc.) are at approximately 0 volts, and BL3 2063 and BL4 2064 are allowed to electrically float. In another embodiment, BL3 2063 and BL4 2064 can be at substantially 0 volts. Referring to FIG. 26, the channel region of the memory cell 2011 allows electrons to flow between BL2 2062 and BL1 2061. The channel region of the memory cell 2011 is adjacent to CG1 2081, SG1 2001, and between the doped regions 104 and 106 that are electrically connected to BL1 2061 and BL2 2062, respectively. More particularly, CG1 2081 and SG2 2001 are biased to allow electrons to flow from BL2 2064 from the doped region 106 to the doped region 104. The electrical field generated in the channel region of the memory cell 2011 near the doped region 104 (via BL1 2061) and CG1 2081 is sufficient to generate hot carriers within the channel region of memory cell 2011 near doped region 104. At least some of the hot carriers are attracted to the discontinuous storage elements at the charge storage region 20111 near the junction formed near the doped region 94 within the substrate 12. The programming mechanism for programming the charge storage region 20111 is HCI.

The charge storage region 20112 within the memory cell 2011 is not programmed because CG1 2081 and SG1 2001 are at relatively high voltages. Memory cells 2012, 2013, 2014, and 2021 to 2024 are not programmed because the voltages on the other gate lines are at substantially zero volts, and because BL3 2063 and BL4 2064 are electrically float or are at substantially the same voltage so that no current flows between those bit lines.

On a relative basis and when the substrate 12 (or associated well region therein) is biased to zero volts, when programming charge storage region 20111, the voltage differences between CG1 2081 and BL2 2062 and between SG1 2001 and BL2 2062 are in a range of approximately one to two times higher than the voltage difference between BL1 2061 and BL2 2062. In a particular embodiment, the voltage difference between CG1 2081 and BL2 2062 is greater than approximately 1.5 times the voltage difference between BL1 2061 and BL2 2062, and the voltage difference between SG1 2001 and BL2 2062 is no greater than approximately 1.5 times the voltage difference between BL1 2061 and BL2 2062.

Charge storage region 20112 can be programmed using the voltages as listed in FIG. 27. As compared to charge storage region 20111, the voltage on SG1 2002 is reduced. The voltages allow a higher electrical field to be formed in the channel region at a location in the substrate 12 between CG1 2081 and SG1 2001. The relatively low voltage on SG1 2002 allows hot carriers to be more strongly attracted to discontinuous storage elements at charge storage region 20112. The programming mechanism for programming charge storage region 20112 is SSI.

On a relative basis and when the substrate 12 (or associated well region therein) is biased to zero volts, when programming charge storage region 20112, the voltage differences between CG1 2081 and BL2 2062 is in a range of approximately one to two times higher than the voltage difference between BL1 2061 and BL2 2062. CG1 2081 is at a higher potential as compared to SG1 2001. In a particular embodiment, the voltage difference between GL1 2041 and BL2 2062 is no greater than approximately 1.6 times the voltage on BL2 2062, and the voltage difference between SG1 2001 and BL2 2062 is approximately 0.24 to 0.5 times the voltage difference between CG1 2081 and BL2 2062.

Regarding the other charge storage regions and memory cells, charge storage regions, 20122, 20132, and 20362 for memory cells 2012 to 2014 are programmed using SSI. All other charge storage regions within memory cells 2012 to 2014 that have not been described are programmed using HCI. All other charge storage regions for memory cells 2021 to 2024 are similar to memory cells 2011 to 2014, respectively. Each memory cell that includes two gate electrodes can store up to four bits of data, and each memory cell that includes one gate electrode can store up to two bits of data.

In another embodiment, not illustrated, the charge storage region 20111 can be programmed using Fowler-Nordheim tunneling. Programming the charge storage region 20111 can be accomplished by creating a potential difference in a range of about 12 to 16 volts between BL1 2061 and CG1 2081. In one embodiment, erasing can be performed by biasing BL1 2061 to approximately +7 volts, setting the CG1 2081 to approximately −7 volts, and allowing the bit lines to electrically float. Note that the voltages used for BL1 2061 and CG1 2081 do not need to be symmetric with respect to 0 volts. For example, a combination of +5 volts and −9 volts can be used. After reading this specification, skilled artisans will be able to determine a set of voltages to be used for Fowler-Nordheim tunneling that meets their needs or desires.

Erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the gate lines to approximately +7 volts, and allowing the bit lines to electrically float. Note that the voltages used for substrate 12 and the gate lines do not need to be symmetric with respect to 0 volts. For example, a combination of −5 volts and +9 volts can be used. After reading this specification, skilled artisans will be able to determine a set of voltages to be used for erasing that meets their needs or desires.

The reading of data within NVM array 18 for memory cells 2011 to 2014 and 2021 to 2024 is given in FIG. 27. When reading datum at charge storage region 20111 of memory cell 2011, BL1 2061 and BL2 2062 are biased so that electrons flow from BL2 2062 to BL1 2061. SG1 2001 is biased so that a portion of the channel regions lying adjacent to GL2 2042 allows carriers to flow. CG1 2081 is biased to a potential between the programmed and erased threshold voltages. In one particular embodiment, the voltage difference between CG1 2081 and BL2 2062 is approximately 0.35 to 0.65 times the voltage difference between SG1 2001 and BL2 2062. A sense amplifier (not illustrated) coupled to the BL1 2061 or BL2 2062 will detect a higher level of current when the charge storage region 20111 is not programmed compared to when the charge storage region 20111 is programmed.

As compared to reading datum at charge storage region 20111, when reading datum at charge storage region 20112, the voltage on CG1 2081 is decreased, and the voltages on BL1 2062 and BL2 2064 are increased. In a particular embodiment, the voltages on CG1 2081 and SG1 2001 are substantially the same, and the voltages on BL1 2061 and BL2 2062 are increased by approximately 1 volt. All other voltages can be kept substantially the same, as compared to when reading charge storage region 20111. In one particular embodiment, the voltage differences between CG1 2081 and BL2 2062 and between SG1 2001 and BL2 2062 are approximately 1 to 3 times the voltage difference between BL1 2061 and BL2 2062. A sense amplifier (not illustrated) coupled to the BL1 2061 or BL2 2062 will detect a higher level of current when the charge storage region 20112 is not programmed compared to when the charge storage region 20112 is programmed. The reading of data at other charge storage regions with memory cells 2012 to 2014, and 2021 to 2024 can be performed in a similar manner.

Programming, erasing, and reading of memory cells in accordance with the embodiments illustrated in FIGS. 21 to 24 can be performed in a similar manner as, except that the control gate and select gate electrodes are reversed.

The processes and structures described allow memory cells or portions thereof to be formed with gate electrodes and doped regions adjacent to the gate electrodes that have dimensions smaller than the resolution limits of lithographic processes. Also, a pair of control gate and select gate electrodes is formed within each trench. More specifically, the gate electrodes 52 and 92 are in the form of spacers, and the 106 (FIG. 12) or the doped regions 136 (see FIG. 15) are adjacent to the gate electrodes 92. The gate electrodes 52 act as control gate electrodes, and the gate electrodes 92 act as select gate electrodes. The gate electrodes 52 and 92 assist in generating a proper electrical field for SSI or HCI programming. Other embodiments described herein allow for an electronic device having a contactless array.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate including a first trench having a first bottom and a first wall, a first gate electrode within the first trench and adjacent to the first wall and overlying the first bottom of the first trench, a second gate electrode within the first trench and adjacent to the first gate electrode and overlying the first bottom of the first trench, and discontinuous storage elements including a first set of discontinuous storage elements. The first set of the discontinuous storage elements can lie between (i) the first gate electrode or the second gate electrode and (ii) the first bottom of the first trench.

In one embodiment of the first aspect, the first gate electrode lies between the second gate electrode and the first wall of the first trench. In a particular embodiment, the first set of the discontinuous storage elements also lies between the first gate electrode and the first wall of the first trench. In another particular embodiment, the first set of the discontinuous storage elements also lies between the first gate electrode and the second gate electrode. In still another particular embodiment, the first set of the discontinuous storage elements only lies between the second gate electrode and the bottom of the first trench. In yet another particular embodiment, the electronic device further includes a first source/drain region and a second source/drain region, wherein the substrate has a primary surface, the first source/drain region lies adjacent to the primary surface and the first wall of the first trench, and the second source/drain region lies adjacent to the bottom of the first trench and is spaced apart from the first wall of the first trench. In another embodiment, each of the first gate electrode and the second gate electrode has a shape, which from a cross-sectional view, is a sidewall spacer.

In still another embodiment of the first aspect, the electronic device further includes a third gate electrode and a fourth gate electrode. In this embodiment, the substrate includes a second trench having a second bottom and a second wall, the third gate electrode lies within the second trench and adjacent to the second wall and overlying the second bottom of the second trench, the fourth gate electrode lies within the second trench and adjacent to the third gate electrode and overlying the second bottom of the second trench, and the discontinuous storage elements including a second set of discontinuous storage elements, wherein the second set of the discontinuous storage elements lies between (i) the second bottom of the second trench and (ii) the third gate electrode or the fourth gate electrode.

In a particular embodiment of the first aspect, the electronic device further includes a first source/drain region, a second source/drain region, and a third source/drain region. In this embodiment, the substrate has a primary surface, the first source/drain region lies adjacent to the primary surface, the first wall of the first trench, and the second wall of the second trench, the second source/drain region lies adjacent to the bottom of the first trench and is spaced apart from the first wall of the first trench, and the third source/drain region lies adjacent to the bottom of the second trench and is spaced apart from the second wall of the second trench. In a more particular embodiment, the first gate electrode lies between the first wall of the first trench and the second gate electrode, the first set of the discontinuous storage elements also lies between the first wall of the first trench and the first gate electrode, the third gate electrode lies between the second wall of the second trench and the fourth gate electrode, and the second set of the discontinuous storage elements also lies between the second wall of the second trench and the third gate electrode.

In a second aspect, a process of forming an electronic device can include forming a first trench within a substrate, wherein the first trench extends from a primary surface of the substrate and has a first wall and a first bottom, forming discontinuous storage elements over the primary surface and within the first trench, forming a first gate electrode within the first trench and adjacent to the first wall and overlying the first bottom of the first trench, forming a second gate electrode within the first trench and adjacent to the first gate electrode and overlying the first bottom of the first trench, and removing a portion of the discontinuous storage elements to form a first set of discontinuous storage elements, wherein the first set of the discontinuous storage elements lies between (i) the first gate electrode or the second gate electrode and (ii) the first bottom of the first trench.

In one embodiment of the second aspect, forming the first gate electrode includes substantially conformally depositing a first gate electrode material over the primary surface of the substrate and within the first trench, and anisotropically etching the gate electrode material to remove a portion of the first gate electrode material from over the primary surface of the substrate to form the first gate electrode. In this embodiment, forming the second gate electrode includes substantially conformally depositing a second gate electrode material over the primary surface of the substrate and the first gate electrode and within the first trench, and anisotropically etching the second gate electrode material to remove a portion of the second gate electrode material from over the primary surface of the substrate to for the second gate electrode.

In another embodiment of the second aspect, forming the discontinuous storage elements is part of forming a charge storage stack, and forming the first gate electrode includes exposing a portion of the charge storage stack. In a particular embodiment, the portion of the discontinuous charge storage elements includes etching the portion of the charge storage stack. In another particular embodiment, removing the portion of the discontinuous charge storage elements includes thermally consuming the portion of the discontinuous charge storage elements.

In still another embodiment of the second aspect, forming the discontinuous storage element is performed after forming the first gate electrode, and removing the portion of the discontinuous charge storage elements is performed after forming the second gate electrode. In a particular embodiment, the process further includes removing another portion of the discontinuous charge storage elements before forming the second gate electrode, wherein the another portion of the discontinuous storage elements overlies the first gate electrode before removing the another portion.

In a third aspect, a process of using an electronic device can include providing a memory cell. The memory cell can include a substrate having a primary surface and including a first trench having a first bottom and a first wall, a first gate electrode within the first trench and adjacent to the first wall and overlying the first bottom of the first trench, and a second gate electrode within the first trench and adjacent to the first gate electrode and overlying the first bottom of the first trench. The memory cell can also include discontinuous storage elements including a first set of discontinuous storage elements, wherein the first set of the discontinuous storage elements can lie between the first gate electrode and the first bottom of the first trench, and can lie between the first gate electrode and the first wall. The memory cell can also include a first source/drain region lying adjacent to the primary surface and the first wall of the first trench and coupled to a first bit line, and a second source/drain region lying adjacent to the bottom of the first trench and is spaced apart from the first wall of the first trench and coupled to a second bit line. The process can also include programming a first bit of the memory cell including biasing the first bit line and the second bit line at a first voltage difference, biasing the second gate electrode, such that a second voltage difference between the second gate electrode and the first bit line is no greater than approximately half of the first voltage difference, and biasing the first gate electrode, such that a third voltage difference between the first gate electrode and the first bit line is in a range of approximately 0.5 to approximately 1.5 times the first voltage difference.

In one embodiment of the third aspect, the process further includes programming a second bit of the memory cell including biasing the first bit line and the second bit line at a fourth voltage difference, biasing the first gate electrode, such that a fifth voltage difference between the first gate electrode and the second bit line is in a range of approximately 0.5 to approximately 1.5 times the first voltage difference, and biasing the second gate electrode, such that a sixth voltage difference between the second gate electrode and the second bit line is in a range of approximately 0.5 to approximately 1.5 times the first voltage difference.

In another embodiment of the third aspect, the process further includes erasing the memory cell including biasing the substrate and the first gate electrode at a fourth voltage difference, such that the fourth voltage difference has an opposite polarity compared to first voltage difference, and the fourth voltage difference has a magnitude that is at least approximately 4 times a magnitude of the first voltage difference, and electrically floating the first bit line and the second bit line.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. An electronic device comprising:
a substrate including a portion that defines a first trench having a first bottom, a first wall, and a second wall opposite the first wall;

a first gate electrode within the first trench and adjacent to the first wall and overlying the first bottom of the first trench;

a second gate electrode within the first trench and adjacent to the first gate electrode and overlying the first bottom of the first trench, wherein the first gate electrode lies between the first wall and the second gate electrode;

a first set of discontinuous storage elements, wherein the first set of discontinuous storage elements lies between (i) the first gate electrode or the second gate electrode and (ii) the first bottom of the first trench;

a third gate electrode within the first trench and adjacent to the second wall and overlying the first bottom of the first trench;

a fourth gate electrode within the first trench and adjacent to the third gate electrode and overlying the first bottom of the first trench, wherein the third gate electrode being between the second wall and the fourth gate electrode;

a second set of discontinuous storage elements, wherein the second set of discontinuous storage elements lies between (i) the third gate electrode or the fourth gate electrode and (ii) the first bottom of the first trench; and wherein a first memory cell comprises the first gate electrode, the second gate electrode, and the first set of discontinuous storage elements; a second memory cell comprises the third gate electrode, the fourth gate electrode, and the second set of discontinuous storage element; and the second gate electrode being between the first gate electrode and the fourth gate electrode.

2. The electronic device of claim 1, wherein the second gate electrode is conformal to the first gate electrode.

3. The electronic device of claim 2, wherein:
the first gate electrode is a select gate electrode;
the second gate electrode is a control gate electrode; and
the first set of the discontinuous storage elements only lies between the second gate electrode and the bottom of the first trench, and substantially no discontinuous storage elements lie between the second gate and the first wall.

4. The electronic device of claim 2, further comprising a first source/drain region and a second source/drain region, wherein:
the substrate has a primary surface;
the first source/drain region lies within the substrate and adjacent to the primary surface and the first wall of the first trench; and
the second source/drain region lies within the substrate and adjacent to the bottom of the first trench and is spaced apart from the first wall of the first trench.

5. The electronic device of claim 1, wherein within the first memory cell, substantially all of the first and second gate electrodes lie within the first trench.

6. The electronic device of claim 1, wherein each of the first gate electrode and the second gate electrode has a shape, which from a cross-sectional view, is a sidewall spacer.

7. The electronic device of claim 1, further comprising a fifth gate electrode, a sixth gate electrode, and a third set of discontinuous storage elements, wherein: the substrate including another portion that defines a second trench having a second bottom and a second wall; the fifth gate electrode lies within the second trench and adjacent to the second wall and overlying the second bottom of the second trench; the sixth gate electrode lies within the second trench and adjacent to the fifth gate electrode and overlying the second bottom of the second trench; and the third set of the discontinuous storage elements lies between (i) the second bottom of the second trench and (ii) the fifth gate electrode or the sixth gate electrode.

8. The electronic device of claim 7, further comprising a first source/drain region, a second source/drain region, and a third source/drain region, wherein:
the substrate has a primary surface;
the first source/drain region lies within the substrate and adjacent to the primary surface, the first wall of the first trench, and the second wall of the second trench;
the second source/drain region lies within the substrate and adjacent to the bottom of the first trench and is spaced apart from the first wall of the first trench; and
the third source/drain region lies adjacent to the bottom of the second trench and is spaced apart from the second wall of the second trench.

9. An electronic device comprising: a substrate including a portion that defines a first trench having a bottom, a first wall, and a second wall opposite the first wall; a first gate electrode within the first trench and adjacent to the first wall and overlying the bottom of the first trench; a second gate electrode within the first trench and adjacent to the first gate electrode and overlying the bottom of the first trench, wherein the first gate electrode lies between the first wall and the second gate electrode; and a first set of discontinuous storage elements, wherein the set of discontinuous storage elements lies between the first gate electrode and the bottom of the first trench; a third gate electrode within the first trench and adjacent to the second wall and overlying the bottom of the first trench; a fourth gate electrode within the first trench and adjacent to the third gate electrode and overlying the bottom of the first trench, wherein the third gate electrode being between the second wall and the fourth gate electrode; a second set of discontinuous storage elements, wherein the second set of discontinuous storage elements lies between (i) the third gate electrode or the fourth gate electrode and (ii) the first bottom of the first trench; and wherein a first memory cell comprises the first gate electrode, the second gate electrode, and the first set of discontinuous storage elements; a second memory cell comprises the third gate electrode, the fourth gate electrode, and the second set of discontinuous storage element; and the second gate electrode being between the first gate electrode and the fourth gate electrode.

10. The electronic device of claim 9, wherein substantially no discontinuous storage element lies between a bottom surface of the second gate electrode and the bottom of the first trench.

11. The electronic device of claim 9, wherein:
within the first memory cell, substantially all of the first and second gate electrodes lie within the first trench;
the substrate includes other portions that define other trenches and other sets of discontinuous storage elements lying within the other trenches; and
substantially all of the discontinuous storage elements lie within the first and other trenches.

12. An electronic device comprising: a substrate including a portion that defines a first trench having a bottom and a first wall and a second wall opposite the first wall; a first gate electrode within the first trench and adjacent to the first wall and overlying the bottom of the first trench; a second gate electrode within the first trench and adjacent to the first gate electrode and overlying the bottom of the first trench; wherein the first gate electrode lies between the first wall and the second gate electrode; and a first set of discontinuous storage elements, wherein the set of discontinuous storage elements lies between the second gate electrode and the bottom of the first trench; a third gate electrode within the first trench and adjacent to the second wall and overlying the bottom of the first trench; a fourth gate electrode within the first trench and adjacent to the third gate electrode and overlying the bottom of the first trench, wherein the third gate electrode being between the second wall and the fourth gate electrode; a second set of discontinuous storage elements, wherein the second set of discontinuous storage elements lies between (i) the third gate electrode or the fourth gate electrode and (ii) the first bottom of the first trench; and wherein a memory cell comprises the first gate electrode, the second gate electrode, and the set of discontinuous storage elements, a second memory cell comprises the third gate electrode, the fourth gate electrode, and the second set of discontinuous storage element; and the second gate electrode being between the first gate electrode and the fourth gate electrode.

13. The electronic device of claim 12, wherein:
the first gate electrode is a select gate electrode;
the second gate electrode is a control gate electrode; and
the first set of discontinuous storage elements is spaced apart from the wall of the first trench.

14. The electronic device of claim 13, wherein within the device, substantially all of the first, second, third, and fourth gate electrodes lie within the first trench.

15. The electronic device of claim 14, wherein substantially no discontinuous storage element lies between the first gate electrode and the bottom of the first trench.

16. The electronic device of claim 12, wherein substantially no discontinuous storage element lies between the first gate electrode and the bottom of the first trench.

17. The electronic device of claim 12, wherein:
the substrate includes other portions that define other trenches;
other sets of discontinuous storage elements lie within the other trenches; and
substantially all of the discontinuous storage elements of a memory array that includes the first and second memory cells lie within the first and other trenches.

* * * * *

UNITED STATES PATENT AND TRADEMARK OFFICE
CERTIFICATE OF CORRECTION

| | |
|---|---|
| PATENT NO. | : 8,193,572 B2 |
| APPLICATION NO. | : 12/647250 |
| DATED | : June 5, 2012 |
| INVENTOR(S) | : Chi-Nan Li et al. |

It is certified that error appears in the above-identified patent and that said Letters Patent is hereby corrected as shown below:

In the Claims:

In Column 22, Line 34, please change "first bottom" to --bottom--.

Signed and Sealed this
Fourth Day of June, 2013

Teresa Stanek Rea
*Acting Director of the United States Patent and Trademark Office*